US009231214B2

(12) United States Patent
Tolbert et al.

(10) Patent No.: US 9,231,214 B2
(45) Date of Patent: Jan. 5, 2016

(54) PHOTOVOLTAIC DEVICES INCLUDING SELF-ASSEMBLING FULLERENE DERIVATIVES FOR IMPROVED EFFICIENCIES

(75) Inventors: Sarah H. Tolbert, Encino, CA (US); Benjamin J. Schwartz, Encino, CA (US); Yves Rubin, Los Angeles, CA (US); Merissa Halim, Diamond Bar, CA (US); Darcy Wanger, Long Beach, CA (US); Christopher J. Tassone, Los Angeles, CA (US); Alexander L. Ayzner, Los Angeles, CA (US); Robert D. Kennedy, Los Angeles, CA (US); Christopher Day, Los Angeles, CA (US)

(73) Assignee: The Regents of the University of California, Oakland, CA (US)

(*) Notice: Subject to any disclaimer, the term of this patent is extended or adjusted under 35 U.S.C. 154(b) by 1196 days.

(21) Appl. No.: 12/419,936

(22) Filed: Apr. 7, 2009

(65) Prior Publication Data

US 2009/0266416 A1     Oct. 29, 2009

Related U.S. Application Data

(60) Provisional application No. 61/043,353, filed on Apr. 8, 2008.

(51) Int. Cl.
| | |
|---|---|
| *H01L 25/00* | (2006.01) |
| *H01L 31/00* | (2006.01) |
| *H01L 51/00* | (2006.01) |
| *B82Y 10/00* | (2011.01) |
| *H01L 51/42* | (2006.01) |

(52) U.S. Cl.
CPC ............. *H01L 51/0047* (2013.01); *B82Y 10/00* (2013.01); *H01L 51/4253* (2013.01); *Y02E 10/549* (2013.01)

(58) Field of Classification Search
CPC ........ H01L 51/30; H01L 31/00; G11C 13/02; C07D 333/00; C07C 13/465
USPC ................... 136/263, 256, 243; 549/246, 13; 546/330; 544/330, 41, 103; 428/835.3; 423/445
See application file for complete search history.

(56) References Cited

U.S. PATENT DOCUMENTS

| | | | |
|---|---|---|---|
| 2005/0217722 A1* | 10/2005 | Komatsu et al. | 136/263 |
| 2006/0076050 A1* | 4/2006 | Williams et al. | 136/263 |
| 2009/0176994 A1 | 7/2009 | Laird et al. | |
| 2011/0089380 A1 | 4/2011 | Hummelen et al. | |

FOREIGN PATENT DOCUMENTS

| | | | |
|---|---|---|---|
| JP | 2006-315474 | | 5/2008 |
| JP | 2008-130889 | | 6/2008 |
| RU | 2287483 | * | 7/2005 |

OTHER PUBLICATIONS

Huang et al., Hierarchical slf-assembly of all organic photovoltaic devices, 2006, Tetrahedron, 62, 2050-2059.*
Barbour, et al. Excitation transport and charge seperation in an organic photovoltaic material: watching excitations diffuse to interfaces. J. Phys. Chem 112:3926-3934 (Feb. 20, 2008).
Campoy-Quiles, et al. Morphology evolution via self-organiation and lateral and vertical diffusion in polymer: fullerene solar cell blends. Nature Materials 7 (Feb. 2008).
Chirvase et al. Influence of nanomorphology on the photovoltaic action of polymer-fullerene composites. Nanotechnolgy 15: 1317-1323 (2004).
Cho et al. Thermal annealing-induced enhancement of the field—effect mobility of regioregular poly(3-hexylthiophene films). J. Appl. Phys. 100: 114503 (2006).
Coffey, eta I. Mapping local photocurrents in plymer/fullerene solar cells with photoconductive atomic force microscopy. Nano Lett. vol. 7:3 738-744 (2007).
Hoeben, et al. About supramolecular assemblies of $\pi$-conjugated systems. Chem. Rev. 105: 1491-1546 (2005).
Geiser, et al. Poly(3-hexylthiophene)/$C_{60}$ heterojunction solar cells: implication of morphology on performance and ambipolar charge collection. Solar Energy Materials & Solar Cells. 92:464-473 (2008).
Haugeneder et al. Exciton diffusion and dissociation in conjugated polymer/fullerene blends and heterostructures. Physical Review B. 59:23 (Jun. 5, 1999).
Hamasaki, eta I. Synthesis of functionalized fullerene by mono-alkylation of fullerene cyclopentadienide. Chem. Lett. 33:3 (2004).
Huang, et al. Hierarchical self-assembly of all-organic photovoltaic devices. Tetrahedron 62: 2050-2059 (2006).
Huebener et al. AFM investigation of the formation of one-dimensional structures of $C_{60}$ shuttlecocks on HOPG. Phys. Stat. So. (b) 243: No. 13:2990-2994 (2006).
Kim et al. Roles of donor and acceptor nanodomains in 6% efficient thermally annealed polymer photovoltaics. Appl. Phys. Lett. 90:63511 (2007).
Lee, et al. Processing additives for improved efficiency from bulk heterojunction solar cells. J. Am. Chem. Soc. 130: 3619-3623 (2008).
Li, et al. "Solvent Annealing" effect in polymer solar cells based on poly(3-hexylthiophene) and methanofullerenes. Adv. Funct. Mater. 17:1636-1644 (2007).
Luzzati et al. Spectroscopical evidences of photoinduced charge transfer in blends of $C_{60}$ and thiophene-based copolymers with a tunable energy gap. Synthetic Materials 116:171-174 (2001).

(Continued)

*Primary Examiner* — Monique Peets
(74) *Attorney, Agent, or Firm* — Foley & Lardner LLP; Cliff Z. Liu

(57) ABSTRACT

Described herein are photovoltaic devices including self-assembling fullerene derivatives. In one embodiment, a photovoltaic device includes a first electrode layer, a second electrode layer, and an active layer disposed between the first electrode layer and the second electrode layer. The active layer is configured to absorb incident light to produce a first type of charge carrier that is transported to the first electrode layer and a second type of charge carrier that is transported to the second electrode layer. The active layer includes self-assembled molecules of a fullerene derivative to provide a conductive path through at least a portion of the active layer.

19 Claims, 7 Drawing Sheets

(56) References Cited

OTHER PUBLICATIONS

McNeill, et al. X-ray microscopy of photovoltaic polyfluorene blends: relating nanomorphology to device performance. Macromolecules 2007, 40:3263-3270 (Mar. 30, 2007).

Ma, et al. Thermally stable, efficient polymer solar cells with nanoscale control of the interpenetrating network morphology. Adv. Functional Mat. 5:1617-1622 (2005).

Matsuo, eta I. Stacking of molecules possessing a fullerene apex and a cup-shaped cavity connected by a silicon connections. J. Am. Chem. Soc. 126:432-433 (2004).

Matsuo et al. Syntheses and structural studies of functional fullerenes. Cheminform 38:26 (Jun. 6, 2007). Abstact Only.

Murayama et al. Fullerene production in tons and more: from science to industry. Fullerenes, Nanotubes, and Carbon Nanostructures vol. 12:1 & 2, pp. 1-9 (2004).

Okada, et al. Electronic structure of stacked $C_{60}$ shuttlecocks. Chem. Physi. Lett. 399:157-161 (2004).

Padinger, et al. Effects of postproduction treatment on plastic solar cells. Adv. Func. Mater.

Peet, et al. Efficiency enhancement in low-bandgap polymer solar cells by processing with alkane dithiols. Nat. Mat.:6 497-500 (Jul. 2007).

Perez, et al. Concave Tetrathiofulvalene-type donors as supramolecular partners for fullerenes. Angew. Chem. Int. Ed. 46:1847-1851 (2007).

Peroukidis, et al. A simple theory of molecular organization in fullerene-containing liquid crystals. J. Chem. Phys. 123:164904 (2005).

Pivrikas, et al. A review of charge transport and recombination in polymer-fullerene organic solar cells. Prog. Photovolt: Res. Appl. 15:677-696 (2007).

Reyes-Reyes. High-efficiency photovoltaic devices based on annealed poly(3-hexylthiophene) and 1-(3-methoxycarbonyl)-proply-1-phenyl-(6,6) $C_{61}$ blends. Appl. Phys. Lett 87:083506-1 (2005).

Sariciftci, et al. Photoinduced electron transfer from a conducting polymer to buckminsterfullerene. Science. 1474-6 (Nov. 27, 1992).

Sariciftci, et al. Semiconducting polymer-buckminsterfullerene heterojunctions: diodes, photodiodes, and photovoltaic cells. Appl. Phys. Lett. 62:6 (Feb. 8, 1993).

Sawamura, et al. Stacking of conical molecules with a fullerene apex into polar columns in crystals and liquid crystals. Nature vol. 419 (Oct. 17, 2002).

Sawamura, et al. Single-step synthesis of pentaaryl-monohydro[60]fullerenes through fivefold addition of organocopper reagent to $C_{60}$. J. Organometallic Chem. 599: 32-36 (2000).

Shaheen et al. 2.5% efficient organic plastic solar cells. Appl. Phys. Lett. 78:6 (841-843) (Feb. 5, 2001).

Soci, et al. Photoconductivity of a low-bandgap conjugated polymer. Adv. Func. Mat. 17:632-636 (2007).

Wang, et al. Polymer solar cells with low-bandgap polymers blended with $C_{70}$ derivative give photocurrent at 1µ. Thin Solid Films. 11-512 576-580 (2006).

Wang et al. Photoconductivity of fullerene-doped polymers. Nature 356:585-587 (Apr. 16, 1992).

Yao, et al. Effects of $C_{70}$ derivative in low band gap polymer photovoltaic devices: spectral complementation and morphology optimization. Appl Phys. Lett 89. 2006.

Zhao, et al. Effects of thermal annealing on polymer photovoltaic cells with buffer layers and in situ formation of interfacial layer for enhancing power conversion efficiency. Synthetic Metals 158: 908-911 (2008).

Zhokhavets et al. Effect of annealing of poly(3-hexylthiophene)/fullerene bulk heterojunction composites on structural and optical properties. Thin Solid Films 496: 679-682 (2006).

Zhong, et al. Convergent synthesis of a polyfunctionalized fullerene by regioselective five-fold addition of a functionalized organocopper reagent to $C_{60}$. Organic Lett. 8:7 1463-1466 (2006).

Zhong, et al. Lamellar assembly of conical molecules possession a fullerene apex in crystals and liquid crystals. J. Am. Chem. Soc. 129:3052-3053 (2007).

\* cited by examiner

PHOTOVOLTAIC DEVICES INCLUDING SELF-ASSEMBLING FULLERENE DERIVATIVES FOR IMPROVED EFFICIENCIES

CROSS REFERENCE TO RELATED APPLICATION

This application claims the benefit of U.S. Provisional Application Ser. No. 61/043,353, filed on Apr. 8, 2008, the disclosure of which is incorporated herein by reference in it entirety.

STATEMENT REGARDING FEDERALLY SPONSORED RESEARCH OR DEVELOPMENT

This invention was made with Government support of under CHE0527015, awarded by the National Science Foundation, and N00014-04-1-0410, awarded by the U.S. Navy, Office of Naval Research. The Government has certain rights in the invention.

FIELD OF THE INVENTION

The invention relates generally to photovoltaic devices. More particularly, the invention relates to photovoltaic devices including self-assembling fullerene derivatives.

BACKGROUND

The increasing cost of fossil fuels has generated a strong interest in renewable solar energy sources. Although relatively efficient, inorganic photovoltaic devices can be costly. Advances in organic bulk heterojunction ("BHJ") photovoltaic devices have opened prospects for the development of less expensive, easily produced alternatives. To date, solar conversion efficiencies of organic BHJ devices have reached about 5-6 percent, still short of the desired 10 percent for commercialization and widespread adoption.

The more efficient organic BHJ devices have been based on a conjugated semiconducting polymer blended or mixed with a fullerene derivative. The fullerene derivative serves as an electron acceptor material to split excitons formed when the polymer absorbs light. The polymer and fullerene components should be mixed together on a length scale that is shorter than an exciton diffusion length, typically about 10 nm, to ensure that most excitons are harvested. It is also desirable that the polymer and fullerene components form bicontinuous interpenetrating networks for efficient transport of separated charge carriers to respective electrodes. Forming an optimal BHJ device is a difficult balancing act: having the components mixed too well can impede the formation of separate polymer and fullerene networks, but too much component separation can lead to the formation of unconnected islands that serve as charge carrier traps. In view of the difficulty of achieving this balance, low performance in BHJ devices remain a significant obstacle.

It is against this background that a need arose to develop the photovoltaic devices and related systems and methods described herein.

SUMMARY

In one embodiment, a photovoltaic device includes a first electrode layer, a second electrode layer, and an active layer disposed between the first electrode layer and the second electrode layer. The active layer is configured to absorb incident light to produce a first type of charge carrier that is transported to the first electrode layer and a second type of charge carrier that is transported to the second electrode layer. The active layer includes self-assembled molecules of a fullerene derivative to provide a conductive path through at least a portion of the active layer.

In another embodiment, a photovoltaic device includes a first electrode layer, a second electrode layer, and an active layer disposed between the first electrode layer and the second electrode layer. The active layer includes molecules of a first fullerene derivative and molecules of a second fullerene derivative that is different from the first fullerene derivative. The molecules of the first fullerene derivative and the molecules of the second fullerene derivative are arranged into a packing structure to provide a conductive path through at least a portion of the active layer, and the molecules of the second fullerene derivative correspond to stopper molecules disposed adjacent to terminal portions of the packing structure.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

DETAILED DESCRIPTION

Definitions

Figure 1:
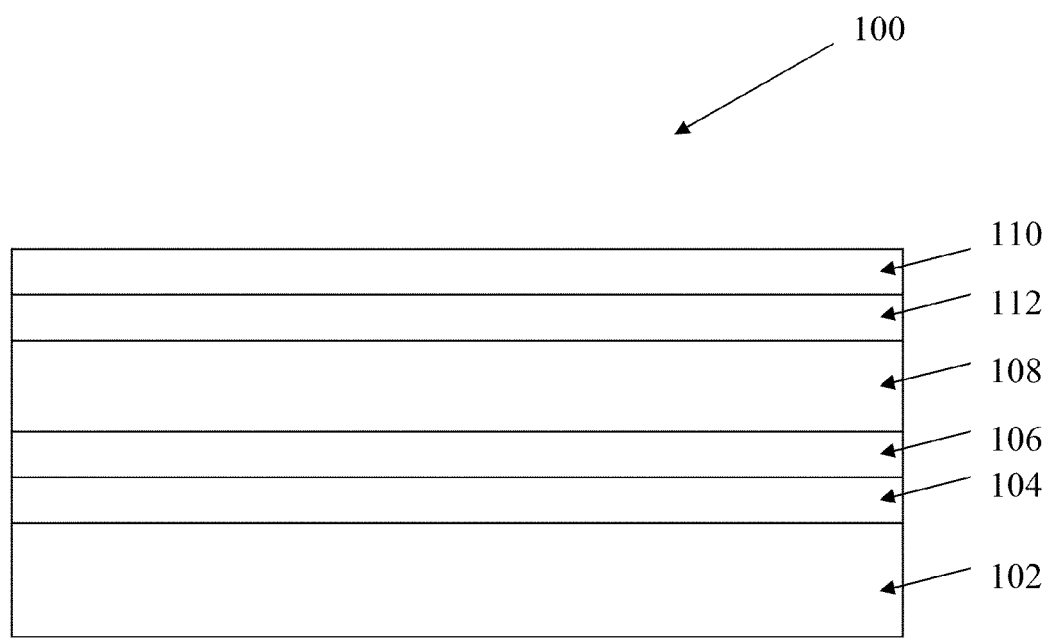
FIG. 1 illustrates a photovoltaic device implemented in accordance with an embodiment of the invention.

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set also can be referred to as members of the set. Objects of a set can be the same or different. In some instances, objects of a set can share one or more common characteristics.

As used herein, the term "adjacent" refers to being near or adjoining. Adjacent objects can be spaced apart from one another or can be in actual or direct contact with one another. In some instances, adjacent objects can be coupled to one another or can be formed integrally with one another.

As used herein, relative terms, such as "exterior," "inner," "outer," "top," "upper," "upwardly," "lower," "bottom," "downwardly," "lateral," and "laterally," refer to an orientation of a set of objects with respect to one another, such as in accordance with the drawings, but do not require a particular orientation of those objects during manufacturing or use.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels or variability of the embodiments described herein.

As used herein, the terms "optional" and "optionally" mean that the subsequently described event or circumstance may or may not occur and that the description includes instances where the event or circumstance occurs and instances in which it does not.

As used herein, the term "bond" and its grammatical variations refer to a coupling of two or more objects. In some instances, a bond can refer to a coupling of two or more atoms based on an attractive interaction, such that the atoms can form a stable or semi-stable structure. Examples of bonds include covalent bonds and non-covalent bonds, such as van der Waals interactions, hydrogen bonds, metal coordination bonds, bonds based on hydrophobic forces, bonds based on π-π interactions, bonds based on electrostatic interactions (e.g., between cations and anions or dipole-dipole interactions), bonds based on charge transfer interactions, and bonds between crown ethers or related structures with cations. The term "intermolecular bond" refers to a bond between two or more atoms included in different molecules, while the term "intramolecular bond" refers to a bond between two or more atoms included in a single molecule, such as, for example, a bond between two groups of the single molecule. Typically, an intermolecular bond includes a set of non-covalent bonds, while an intramolecular bond includes a set of covalent bonds.

As used herein, the term "group" refers to a set of atoms that form a portion of a molecule. In some instances, a group can include two or more atoms that are bonded to one another to form a portion of a molecule. A group can be monovalent or polyvalent to allow bonding to one or more additional groups of a molecule. For example, a monovalent group can be envisioned as a molecule with one of its hydrogen atoms removed to allow bonding to another group of a molecule. A group can be neutral, positively charged, or negatively charged. For example, a positively charged group can be envisioned as a neutral group with one or more protons (i.e., H+) added, and a negatively charged group can be envisioned as a neutral group with one or more protons removed. Examples of groups include those set forth in the following.

As used herein, the term "alkane" refers to a saturated hydrocarbon molecule. For certain implementations, an alkane can include from 1 to 100 carbon atoms. The term "lower alkane" refers to an alkane that includes from 1 to 20 carbon atoms, such as from 1 to 10 carbon atoms, while the term "upper alkane" refers to an alkane that includes more than 20 carbon atoms, such as from 21 to 100 carbon atoms. The term "branched alkane" refers to an alkane that includes a set of branches, while the term "unbranched alkane" refers to an alkane that is straight-chained. The term "cycloalkane" refers to an alkane that includes a set of ring structures, such as a single ring structure or a bicyclo or higher order cyclic structure. The term "heteroalkane" refers to an alkane that has a set of its carbon atoms replaced by a set of heteroatoms, such as N, Si, S, O, and P. The term "substituted alkane" refers to an alkane that has a set of its hydrogen atoms replaced by a set of substituent groups, while the term "unsubstituted alkane" refers to an alkane that lacks such replacement. Combinations of the above terms can be used to refer to an alkane having a combination of characteristics. For example, the term "branched lower alkane" can be used to refer to an alkane that includes from 1 to 20 carbon atoms and a set of branches.

As used herein, the term "alkyl group" refers to a monovalent form of an alkane. For example, an alkyl group can be envisioned as an alkane with one of its hydrogen atoms removed to allow bonding to another group of a molecule. The term "lower alkyl group" refers to a monovalent form of a lower alkane, while the term "upper alkyl group" refers to a monovalent form of an upper alkane. The term "branched alkyl group" refers to a monovalent form of a branched alkane, while the term "unbranched alkyl group" refers to a monovalent form of an unbranched alkane. The term "cycloalkyl group" refers to a monovalent form of a cycloalkane, and the term "heteroalkyl group" refers to a monovalent form of a heteroalkane. The term "substituted alkyl group" refers to a monovalent form of a substituted alkane, while the term "unsubstituted alkyl group" refers to a monovalent form of an unsubstituted alkane. Examples of alkyl groups include methyl, ethyl, n-propyl, isopropyl, cyclopropyl, n-butyl, s-butyl, isobutyl, t-butyl, cyclobutyl, n-pentyl, 1-adamantyl, 2-pinenyl, and charged, hetero, or substituted forms thereof.

As used herein, the term "alkene" refers to an unsaturated hydrocarbon molecule that includes a set of carbon-carbon double bonds. For certain implementations, an alkene can include from 2 to 100 carbon atoms. The term "lower alkene" refers to an alkene that includes from 2 to 20 carbon atoms, such as from 2 to 10 carbon atoms, while the term "upper alkene" refers to an alkene that includes more than 20 carbon atoms, such as from 21 to 100 carbon atoms. The term "cycloalkene" refers to an alkene that includes a set of ring structures, such as a single ring structure or a bicyclo or higher order cyclic structure. The term "heteroalkene" refers to an alkene that has a set of its carbon atoms replaced by a set of heteroatoms, such as N, Si, S, O, and P. The term "substituted alkene" refers to an alkene that has a set of its hydrogen atoms replaced by a set of substituent groups, while the term "unsubstituted alkene" refers to an alkene that lacks such replacement. Combinations of the above terms can be used to refer to an alkene having a combination of characteristics. For example, the term "substituted lower alkene" can be used to refer to an alkene that includes from 1 to 20 carbon atoms and a set of substituent groups.

As used herein, the term "alkenyl group" refers to a monovalent form of an alkene. For example, an alkenyl group can be envisioned as an alkene with one of its hydrogen atoms removed to allow bonding to another group of a molecule. The term "lower alkenyl group" refers to a monovalent form of a lower alkene, while the term "upper alkenyl group" refers to a monovalent form of an upper alkene. The term "cycloalkenyl group" refers to a monovalent form of a cycloalkene, and the term "heteroalkenyl group" refers to a monovalent form of a heteroalkene. The term "substituted alkenyl group" refers to a monovalent form of a substituted alkene, while the term "unsubstituted alkenyl group" refers to a monovalent form of an unsubstituted alkene. Examples of alkenyl groups include ethenyl, 2-propenyl (i.e., allyl), isopropenyl, cyclopropenyl, butenyl, isobutenyl, t-butenyl, cyclobutenyl, and charged, hetero, or substituted forms thereof.

As used herein, the term "alkyne" refers to an unsaturated hydrocarbon molecule that includes a set of carbon-carbon triple bonds. In some instances, an alkyne can also include a set of carbon-carbon double bonds. For certain implementations, an alkyne can include from 2 to 100 carbon atoms. The term "lower alkyne" refers to an alkyne that includes from 2 to 20 carbon atoms, such as from 2 to 10 carbon atoms, while the term "upper alkyne" refers to an alkyne that includes more than 20 carbon atoms, such as from 21 to 100 carbon atoms. The term "cycloalkyne" refers to an alkyne that includes a set of ring structures, such as a single ring structure or a bicyclo or higher order cyclic structure. The term "heteroalkyne" refers to an alkyne that has a set of its carbon atoms replaced by a set of heteroatoms, such as N, Si, S, O, and P. The term "substituted alkyne" refers to an alkyne that has a set of its hydrogen atoms replaced by a set of substituent groups, while the term "unsubstituted alkyne" refers to an alkyne that lacks such replacement. Combinations of the above terms can be used to refer to an alkyne having a combination of characteristics. For example, the term "substituted lower alkyne" can be used to refer to an alkyne that includes from 1 to 20 carbon atoms and a set of substituent groups.

As used herein, the term "alkynyl group" refers to a monovalent form of an alkyne. For example, an alkynyl group can be envisioned as an alkyne with one of its hydrogen atoms removed to allow bonding to another group of a molecule. The term "lower alkynyl group" refers to a monovalent form of a lower alkyne, while the term "upper alkynyl group" refers to a monovalent form of an upper alkyne. The term "cycloalkynyl group" refers to a monovalent form of a cycloalkyne, and the term "heteroalkynyl group" refers to a monovalent form of a heteroalkyne. The term "substituted alkynyl group" refers to a monovalent form of a substituted alkyne, while the term "unsubstituted alkynyl group" refers to a monovalent form of an unsubstituted alkyne. Examples of alkynyl groups include ethynyl, propynyl, isopropynyl, butynyl, isobutynyl, t-butynyl, and charged, hetero, or substituted forms thereof.

As used herein, the term "arene" refers to an aromatic hydrocarbon molecule. For certain implementations, an arene can include from 5 to 100 carbon atoms. The term "lower arene" refers to an arene that includes from 5 to 20 carbon atoms, such as from 5 to 14 carbon atoms, while the term "upper arene" refers to an arene that includes more than 20 carbon atoms, such as from 21 to 100 carbon atoms. The term "monocyclic arene" refers to an arene that includes a single aromatic ring structure, while the term "polycyclic arene" refers to an arene that includes more than one aromatic ring structure, such as two or more aromatic ring structures that are bonded via a carbon-carbon bond or that are fused together. The term "heteroarene" refers to an arene that has a set of its carbon atoms replaced by a set of heteroatoms, such as N, Si, S, O, and P. The term "substituted arene" refers to an arene that has a set of its hydrogen atoms replaced by a set of substituent groups, while the term "unsubstituted arene" refers to an arene that lacks such replacement. Combinations of the above terms can be used to refer to an arene having a combination of characteristics. For example, the term "monocyclic lower alkene" can be used to refer to an arene that includes from 5 to 20 carbon atoms and a single aromatic ring structure.

As used herein, the term "aryl group" refers to a monovalent form of an arene. For example, an aryl group can be envisioned as an arene with one of its hydrogen atoms removed to allow bonding to another group of a molecule. The term "lower aryl group" refers to a monovalent form of a lower arene, while the term "upper aryl group" refers to a monovalent form of an upper arene. The term "monocyclic aryl group" refers to a monovalent form of a monocyclic arene, while the term "polycyclic aryl group" refers to a monovalent form of a polycyclic arene. The term "heteroaryl group" refers to a monovalent form of a heteroarene. The term "substituted aryl group" refers to a monovalent form of a substituted arene, while the term "unsubstituted aryl group" refers to a monovalent form of an unsubstituted arene. Examples of aryl groups include phenyl, biphenylyl, naphthyl, pyridinyl, pyridazinyl, pyrimidinyl, pyrazinyl, quinolyl, isoquinolyl, and charged, hetero, or substituted forms thereof.

As used herein, the term "hydride group" refers to —H.

As used herein, the term "deuteride group" refers to —D.

As used herein, the term "halo group" refers to —X, where X is a halogen atom. Examples of halo groups include fluoro, chloro, bromo, and iodo.

As used herein, the term "hydroxy group" refers to —OH.

As used herein, the term "alkoxy group" refers to —OR, where R is an alkyl group.

As used herein, the term "alkenoxy group" refers to —OR, where R is an alkenyl group.

As used herein, the term "alkynoxy group" refers to —OR, where R is an alkynyl group.

As used herein, the term "aryloxy group" refers to —OR, where R is an aryl group.

As used herein, the term "thio group" refers to —SH.

As used herein, the term "alkylthio group" refers to —SR, where R is an alkyl group.

As used herein, the term "alkenylthio group" refers to —SR, where R is an alkenyl group.

As used herein, the term "alkynylthio group" refers to —SR, where R is an alkynyl group.

As used herein, the term "arylthio group" refers to —SR, where R is an aryl group.

As used herein, the term "alkylcarbonyl group" refers to R(C=O)—, where R is an alkyl group.

As used herein, the term "alkenylcarbonyl group" refers to R(C=O)—, where R is an alkenyl group.

As used herein, the term "alkynylcarbonyl group" refers to R(C=O)—, where R is an alkynyl group.

As used herein, the term "arylcarbonyl group" refers to R(C=O)—, where R is an aryl group.

As used herein, the term "cyano group" refers to —CN.

As used herein, the term "nitro group" refers to —NO$_2$.

As used herein, the term "amino group" refers to —NH$_2$.

As used herein, the term "N-substituted amino group" refers to an amino group that has a set of its hydrogen atoms replaced by a set of substituent groups. Examples of N-substituted amino groups include —NRR', where R and R' are independently selected from hydride groups, alkyl groups, alkenyl groups, alkynyl groups, and aryl groups, and at least one of R and R' is not a hydride group.

As used herein, the term "amide group" refers to —(C=O)NH$_2$.

As used herein, the term "N-substituted amide group" refers to an amide group that has a set of its hydrogen atoms replaced by a set of substituent groups. Examples of N-substituted amide groups include —(C=O)NRR', where R and R' are independently selected from hydride groups, alkyl groups, alkenyl groups, alkynyl groups, and aryl groups, and at least one of R and R' is not a hydride group.

As used herein, the term "silyl group" refers to —SiRR'R", where R, R', and R" are independently selected from a wide variety of groups, such as hydride groups, alkyl groups, alkenyl groups, alkynyl groups, and aryl groups.

As used herein, the term "siloxy group" refers to —OSiRR'R", where R, R', and R" are independently selected from a wide variety of groups, such as hydride groups, alkyl groups, alkenyl groups, alkynyl groups, and aryl groups.

As used herein, the term "fullerene" refers to a material including a set of carbon cage molecules. For certain implementations, a fullerene molecule can include a three-dimensional skeleton that includes multiple carbon atoms, and that forms a closed shell, which can be spherical or semi-spherical in shape. Carbon atoms of a fullerene molecule typically are bonded to three nearest-neighbors arranged in a tetrahedral geometry. A fullerene molecule can be designated as $C_n$, where n is an integer corresponding to the number of carbon atoms included in a carbon skeleton of the fullerene molecule. For example, $C_{60}$ refers to a truncated icosahedron molecule including 32 faces, of which 12 are substantially pentagonal and 20 are substantially hexagonal. Other examples of fullerene molecules include $C_n$, where n is in the range of 50 to 250, such as $C_{70}$, $C_{72}$, $C_{74}$, $C_{76}$, $C_{78}$, $C_{80}$, $C_{82}$, and $C_{84}$. The term "fullerene derivative" refers to a fullerene that has been modified in any manner, including charged, hetero, or substituted forms thereof.

Photovoltaic Devices

FIG. 1 illustrates a photovoltaic device 100 implemented in accordance with an embodiment of the invention. The photovoltaic device 100 includes a substrate 102, which faces incident solar radiation and is formed from a glass, a polymer, or another suitable material that is substantially transparent or semi-transparent in the visible range, as well as in the ultraviolet and infrared ranges bordering the visible range. Disposed on top of the substrate 102 are a set of photovoltaic device layers, including an electrode layer 104, a planarizing layer 106, an active layer 108, a carrier transport layer 112, and an electrode layer 110. Each of the photovoltaic device layers is formed as a set of coatings or films. While not illustrated in FIG. 1, an anti-reflection layer can be formed adjacent to an exterior surface of the substrate 102 to reduce reflection of incident solar radiation. Also, while the single substrate 102 is illustrated in FIG. 1, it is contemplated that a pair of substrates can be included so as to sandwich the photovoltaic device layers.

In the illustrated embodiment, the electrode layer 104 serves as a transparent electrical contact facing incident solar radiation, while the electrode layer 110 serves as a back electrical contact. Accordingly, the electrode layer 104 is desirably formed from an electrically conductive material that is substantially transparent or semi-transparent. Examples of suitable electrically conductive materials for the electrode layer 104 include transparent conductive oxides, such as indium-doped tin oxide ("ITO"), aluminum-doped zinc oxide, and fluorinated tin oxide; transparent conductive polymers; and mixtures thereof. The electrode layer 110 can also be formed from an electrically conductive material that is substantially transparent or semi-transparent. Other examples of suitable electrically conductive materials for the electrode layer 110 include metals, such as aluminum, copper, gold, silver, and steel; metal alloys; doped materials; and mixtures thereof. Each of the electrode layers 104 and 110 can have a thickness in the range of about 1 nm to about 500 nm, such as from about 10 nm to about 200 nm or from about 50 nm to about 150 nm.

Referring to FIG. 1, the planarizing layer 106 is disposed between the electrode layer 104 and the active layer 108, and serves to improve electrical connection between the electrode layer 104 and the active layer 108. An example of a suitable material for the planarizing layer 106 is poly(ethylene dioxythiophene):poly(styrenesulfonic acid) ("PEDOT:PSS"), which can planarize a relatively rough surface of the electrode layer 104. In such manner, use of PEDOT:PSS can facilitate formation of the active layer 108 on top of the electrode layer 104, and can reduce instances of gaps or voids that might otherwise lead to electrical shorts. The planarizing layer 106 can have a thickness in the range of about 1 nm to about 300 nm, such as from about 10 nm to about 150 nm or from about 10 nm to about 100 nm. It is contemplated that another suitable material can be used in place of, or in conjunction with, PEDOT:PSS. It is also contemplated that the electrode layer 104 can be subjected to surface treatment, such that the planarizing layer 106 can be optionally omitted for another implementation. It is further contemplated that the planarizing layer 106 can serve as a carrier transport layer to transport one type of charge carrier, such as holes or electrons, to the electrode layer 104 and to substantially block transport of another type of charger carrier, such as electrons or holes, to the electrode layer 104.

The active layer 108 is disposed between the planarizing layer 106 and the electrode layer 110, and includes a pair of materials, namely an electron donor material and an electron acceptor material. In the illustrated embodiment, the electron donor material serves as a matrix within which the electron acceptor material is disposed, and an interface between the electron donor material and the electron acceptor material serves as a photovoltaic junction where charge separation occurs. Examples of suitable electron donor materials for the active layer 108 include semiconducting polymers including conjugated π-bonds, such as poly(3-hexylthiophene-2,5-diyl) ("P3HT") and poly(2-methoxy-5-(2'-ethyl-hexyloxy)-1,4-phenylene vinylene) ("MEH-PPV"); porphyrins; other p-type or hole-transporting organic materials; and mixtures thereof. Examples of suitable electron acceptor materials for the active layer 108 include fullerene derivatives as described herein. A weight ratio between the electron acceptor material and the electron donor material can be in the range of about 0.1:1 to about 2:1, such as from about 0.5:1 to about 1.2:1 or from about 0.8:1 to about 1:1.

Referring to FIG. 1, the carrier transport layer 112 is disposed between the active layer 108 and the electrode layer 110, and serves to transport one type of charge carrier, such as electrons or holes, to the electrode layer 110 and to substantially block transport of another type of charge carrier, such as holes or electrons, to the electrode layer 110. Examples of suitable materials for the carrier transport layer 112 include fullerenes; LiF; metal oxides, such as zinc oxide and titanium oxide, and mixtures thereof. The carrier transport layer 112 can have a thickness in the range of about 1 nm to about 300 nm, such as from about 10 nm to about 150 nm or from about 10 nm to about 100 nm. It is contemplated that the carrier transport layer 112 can be optionally omitted for another implementation.

During operation of the photovoltaic device 100, a certain fraction of incident solar radiation penetrates the substrate 102, the electrode layer 104, and the planarizing layer 106, and is absorbed by either, or both, of the electron donor material and the electron acceptor material within the active layer 108. Absorption of solar radiation produces photo-excited charge carriers in the form of electron-hole pairs. Electron-hole pairs are separated adjacent to the interface between the electron donor material and the electron acceptor material, such as by transfer of electrons from the electron donor material to the electron acceptor material, by transfer of holes from the electron acceptor material to the electron donor material, or both. Electrons are transported within the active layer 108 and exit the photovoltaic device 100 through one of the electrode layers 104 and 110, such as the electrode layer 110, while holes are transported within the active layer 108 and exit the photovoltaic device 100 through another one of the electrode layers 104 and 110, such as the electrode layer 104. The net effect is a flow of an electric current through the photovoltaic device 100 driven by incident solar radiation. It is contemplated that the geometry of the photovoltaic device 100 can be varied from that illustrated in FIG. 1, and that more or less active layers and electrode layers can be included for another implementation, such as for a bilayer implementation or a multi-junction implementation.

The active layer 108 can have a thickness in the range of about 1 nm to about 1 μm, such as from about 10 nm to about 300 nm or from about 50 nm to about 150 nm. The thickness of the active layer 108 can be selected by balancing between a desired level of optical absorption and a desired level of charge recombination. In particular, by increasing the thickness of the active layer 108, a greater material volume can intercept incident solar radiation as well as any scattered solar radiation, thereby enhancing optical absorption within the active layer 108. On the other hand, by decreasing the thickness of the active layer 108, charge recombination can be reduced due to shorter distances that separated charge carriers have to travel before reaching either of the electrode layers 104 and 110.

Advantageously, the photovoltaic device 100 is implemented as an organic BHJ photovoltaic device that exhibits improved efficiencies in terms of conversion of incident solar radiation to useful electrical energy. In particular, the active layer 108 is implemented so as to satisfy the dual criteria of intimate blending, which is desirable to efficiently separate excitons into electrons and holes, and the formation of a substantially continuous network for each type of charge carrier, which is desirable to efficiently transport the separated electrons and holes to the electrode layers 104 and 110 while minimizing or reducing charge carrier traps or charge recombination. In the illustrated embodiment, a semiconducting polymer (or another suitable electron donor material) and a set of fullerene derivatives are blended or mixed together on a length scale that is shorter than an exciton diffusion length, typically about 10 nm, to ensure that most excitons are harvested. This blending effectively forms a nanoscale photovoltaic junction that is distributed throughout the active layer 108. Given that a material volume in the active layer 108 is in close proximity to the photovoltaic junction, irrespective of location within the material volume, charge separation can be effective for a greater fraction of photoexcited excitons, irrespective of their locations within the active layer 108. At the same time, the semiconducting polymer and the set of fullerene derivatives form bicontinuous interpenetrating networks that serve as conductive paths to the electrode layers 104 and 110. Under the presence of a built-in electric field provided by a mismatch of work functions of the electrode layers 104 and 110, holes can be transported within one network formed by the semiconducting polymer towards one of the electrode layers 104 and 110, while electrons can be transported within another network formed by the set of fullerene derivatives towards another one of the electrode layers 104 and 110. As further described herein, satisfying the dual criteria of intimate blending and the formation of bicontinuous interpenetrating networks is accomplished through proper design of the set of fullerene derivatives so as to self-assemble into a packing structure, with the semiconducting polymer filling gaps or voids of the packing structure. By implementing the photovoltaic device 100 in such manner, a resulting solar energy conversion efficiency can be at least about 1.5 percent, such as at least about 3 percent, at least about 6 percent, at least about 7 percent, or at least about 8 percent, and up to about 10 percent or more, such as up to about 11 percent or up to about 12 percent.

During manufacturing of the photovoltaic device 100, various photovoltaic device layers can be sequentially formed on top of the substrate 102 using the same deposition technique or different deposition techniques. Examples of suitable deposition techniques include atomic layer deposition, thermal evaporation, electron-beam evaporation, physical vapor deposition, chemical vapor deposition, plating, dip coating, doctor blading, inkjet printing, sputtering, spray coating, and spin coating. For example, in the case of the active layer 108, the set of fullerene derivatives can be blended with the semiconducting polymer (or another suitable electron donor material) in solution, using a set of organic solvents, such as anisole, chlorobenzene, o-dichlorobenzene, $CS_2$, chloroform, n-pentane, 1-chloronaphthalene, toluene, methanol, or a mixture thereof. The blended solution can next be applied to the planarizing layer 106 using a spin coating technique to form the active layer 108, although it is contemplated that doctor blading, dip coating, inkjet printing, thermal evaporation, or another suitable deposition technique can also be used. Various post-formation treatments, which modify a molecular architecture within the bulk of the active layer 108, can be applied to the photovoltaic device 100 to enhance its performance, such as thermal annealing, addition of co-solvents or other additives, exposure to solvent vapor, and electric field treatments. For example, the photovoltaic device 100 can be subjected to thermal annealing at a temperature in the range of about 160° C. to about 180° C. (or another suitable temperature near or slightly above the semiconducting polymer's glass transition temperature) for a period of time in the range of about 1 min to about 20 min, such as from about 1 min to about 5 min.

Self-Assembling Fullerene Derivatives

The current approach exploits synthetic variability of fullerene derivatives to control a propensity of fullerene molecules to interact with one another and their relative molecular orientation within a packing structure. This control is accomplished through built-in molecular self-assembly to tune a distance between the fullerene molecules in the packing structure, thus affecting characteristics that contribute to efficient light harvesting, such as a rate of inter-fullerene electron transfer. In addition, the strength of fullerene-fullerene interactions can be tuned relative to a strength of polymer-fullerene interactions, thus allowing control over an extent of blending between polymer and fullerene components and the formation of bicontinuous interpenetrating networks. Moreover, the self-assembling fullerene component can be designed with enhanced optical characteristics, thereby yielding a greater contribution to an overall light absorption, and with enhanced solubility in a variety of organic solvents, thereby facilitating manufacturing operations. By optimizing charge separation and charge transport characteristics, a resulting photovoltaic device exhibits improved efficiencies in terms of conversion of incident solar radiation to useful electrical energy.

For certain implementations, self-assembly of fullerene derivatives can be controlled by suitable selection of a set of substituent groups, which can induce a propensity for a variety of different packing motifs, including one-dimensional columns or stacks, two-dimensional networks, and extensively connected three-dimensional networks such as fractal-like networks. For example, a set of substituent groups can form a cavity or a cup, similar to "feathers" of a shuttlecock, and can promote the formation of a packing structure, in which a curved surface of one fullerene molecule fits into a cavity of another fullerene molecule, and the fullerene molecules are coupled via π-π interactions. By suitable selection of substituent groups, a size and a shape of a cavity can be controlled, which, in turn, allows control over a physical ordering of fullerene molecules and a strength of π-π interactions between adjacent fullerene molecules. In particular, a cavity that has a correct size or shape can promote a desired proximity between adjacent fullerene molecules, such that there is a relatively strong π-π interaction between the fullerene molecules, thereby leading to stacking of the fullerene molecules. In some instances, a cavity that has a correct size or shape is such that a density of fullerene molecules in a crystalline form is at least about $4 \times 10^{-4}$ molecules/$Å^3$, such as at least about $5 \times 10^{-4}$ molecules/$Å^3$, at least about $6 \times 10^{-4}$ molecules/$Å^3$, or at least about $8 \times 10^{-4}$ molecules/$Å^3$, and up to about $10 \times 10^{-4}$ molecules/$Å^3$ or more, such as up to about $11 \times 10^{-4}$ molecules/$Å^3$ or more. It should be recognized that the density of fullerene molecules within a polymer matrix can be reduced from the ranges provided above, such as by a factor of about 1.5, by a factor of about 2, by a factor of about 5, or by a factor of about 10 or more. On the other hand, if the cavity lacks the correct size or shape to promote the desired proximity, π-π interaction between the fullerene molecules may lack sufficient strength, such that the fullerene molecules can be arranged semi-randomly or in another manner without stacking. It should be recognized that π-π interactions are one example of a larger class of intermolecular bonds that can be used to promote and control self-assembly. Other examples of intermolecular bonds include hydrogen bonds, bonds based on electrostatic interactions, and other non-covalent bonds.

According to an embodiment of the invention, a suitable fullerene derivative is a 6,9,12,15,18-penta-substituted-1-hydro-$C_{60}$ given by the formula:

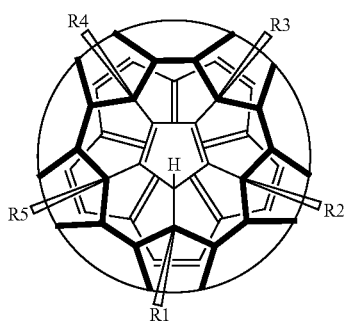

(I)

In formula (I), $R_1$, $R_2$, $R_3$, $R_4$, and $R_5$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (I) can be formed following a procedure of FIG. 2, which illustrates an example for the formation of 6,9,12,15,18-pentaaryl-1-hydro-$C_{60}$. Other fullerene derivatives given by formula (I) can be formed following a procedure of FIG. 3, which illustrates an example for the formation of 6,9,12,15,18-pentaalkynyl-1-hydro-$C_{60}$.

According to another embodiment of the invention, a suitable fullerene derivative is a 6,9,12,15,18-penta-substituted-1-R—$C_{60}$ given by the formula:

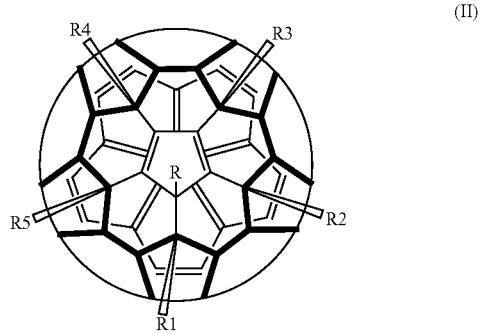

(II)

In formula (II), $R_1$, $R_2$, $R_3$, $R_4$, and $R_5$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups, and R is selected from a variety of small-sized substituent groups, such as deuteride group, halo groups, hydroxy group, methyl group, thio group, and metal cations. Certain fullerene derivatives given by formula (II) can be formed following the procedure of FIG. 2, which illustrates an example for the formation of 6,9,12,15,18-pentaaryl-1-R—$C_{60}$.

According to another embodiment of the invention, a suitable fullerene derivative is a 1,9-epoxy-6,12,15,18-tetra-substituted-$C_{60}$ given by the formula:

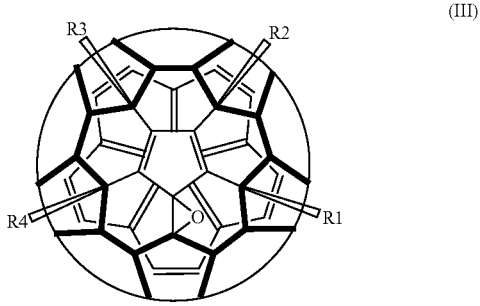

(III)

In formula (III), $R_1$, $R_2$, $R_3$, and $R_4$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

According to another embodiment of the invention, a suitable fullerene derivative is a 1,9-dihydroxy-6,12,15,18-tetra-substituted-$C_{60}$ given by the formula:

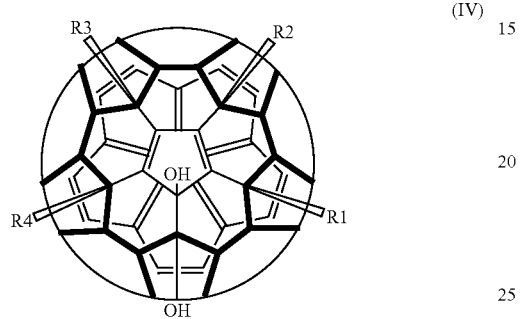

(IV)

In formula (IV), $R_1$, $R_2$, $R_3$, and $R_4$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

According to another embodiment of the invention, a suitable fullerene derivative is a 6,12,15,18-tetra-substituted-$C_{60}$ given by the formula:

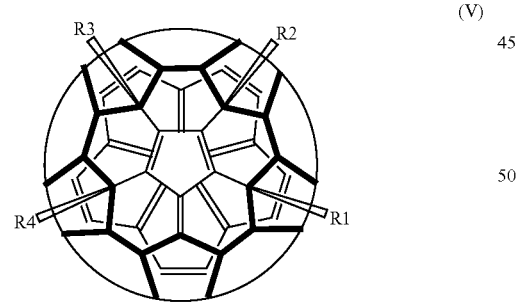

(V)

In formula (V), $R_1$, $R_2$, $R_3$, and $R_4$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

According to another embodiment of the invention, a suitable fullerene derivative is a 6,9,12,15,18-penta-substituted-1-aza-$C_{60}$ (or $C_{59}N$) given by the formula:

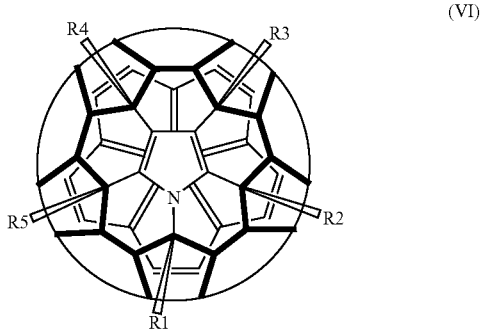

(VI)

In formula (VI), $R_1$, $R_2$, $R_3$, $R_4$, and $R_5$ are independently selected from a variety of substituent groups, such as deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (VI) can be formed using $C_{59}N$ and following a similar procedure as FIG. 2.

According to another embodiment of the invention, a suitable fullerene derivative is a $C_{60}$ e,e,e-trisadduct given by the formula:

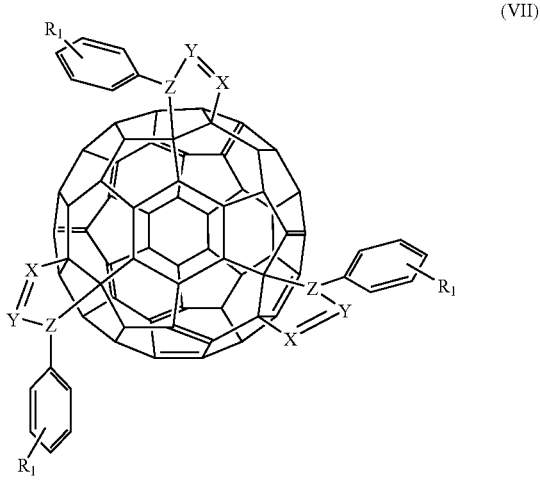

(VII)

In formula (VII), X, Y, and Z are independently selected from O, S, $NR_2$, and $CR_3$, and $R_1$, $R_2$, and $R_3$ are independently selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (VII) can be formed by 1,3-dipolar cycloadditions, and can exhibit self-assembly through van der Waals interactions or dipole-dipole interactions between substituent groups of one fullerene molecule and an adjacent fullerene molecule.

According to another embodiment of the invention, a suitable fullerene derivative is a $C_{60}$ e,e,e-trisadduct given by the formula:

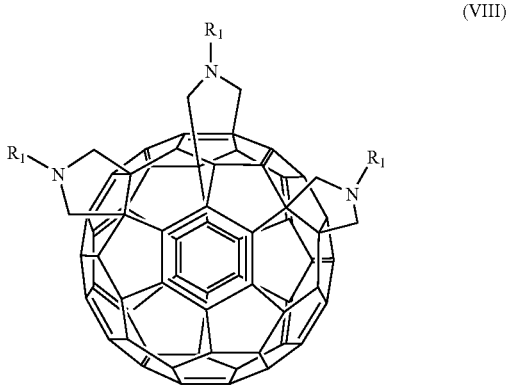

(VIII)

In formula (VIII), $R_1$ is selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (VIII) can exhibit self-assembly through interactions between $R_1$ groups of one fullerene molecule and an adjacent fullerene molecule.

According to another embodiment of the invention, a suitable fullerene derivative is a $C_{60}$ e,e,e-trisadduct given by the formula:

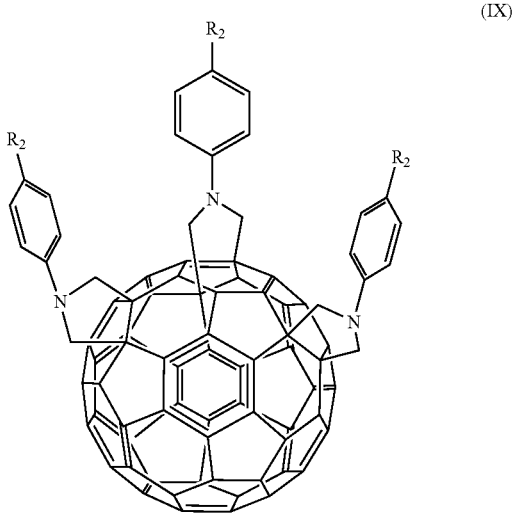

(IX)

In formula (IX), $R_2$ is selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (IX) can exhibit self-assembly through interactions between $R_2$ groups of one fullerene molecule and an adjacent fullerene molecule.

According to another embodiment of the invention, a suitable fullerene derivative is a $C_{60}$ e,e,e-trisadduct given by the formula:

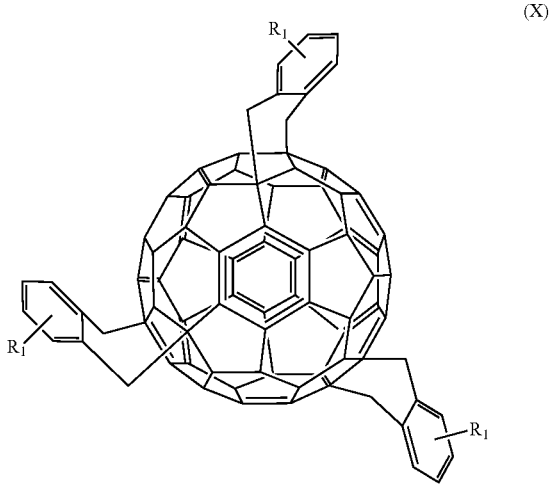

(X)

In formula (X), $R_1$ is selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (X) can be formed by Diels-Alder additions, and can exhibit self-assembly through interactions between substituent groups of one fullerene molecule and an adjacent fullerene molecule.

According to another embodiment of the invention, a suitable fullerene derivative is a $C_{60}$ e,e,e-trisadduct given by the formula:

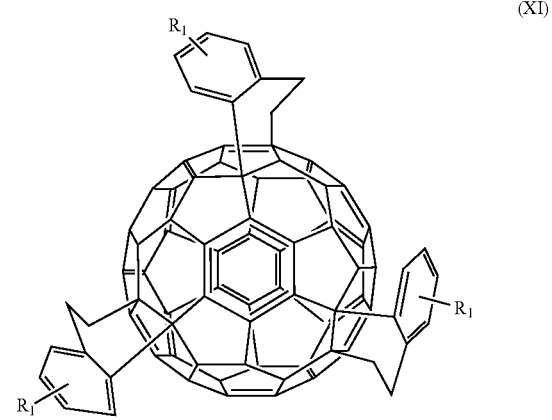

(XI)

In formula (XI), $R_1$ is selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formula (XI) can exhibit self-assembly through interactions between substituent groups of one fullerene molecule and an adjacent fullerene molecule.

According to another embodiment of the invention, a suitable fullerene derivative is a mono- or di-substituted-$C_{60}$ given by one of the formulas:

(A)
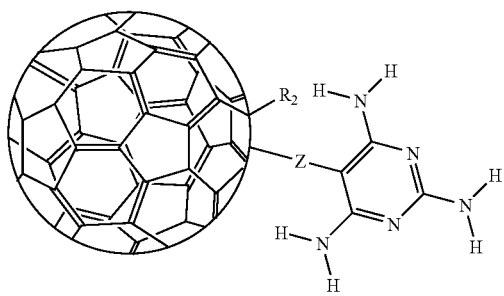

(B)
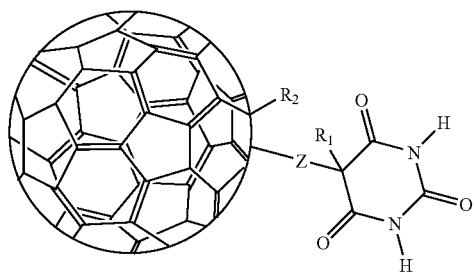

(C)
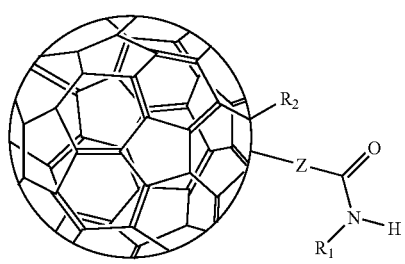

(D)
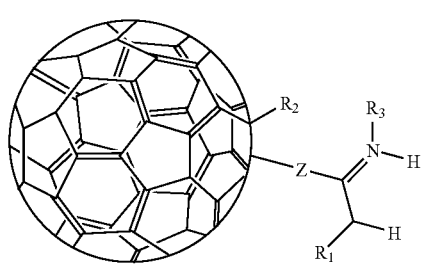

-continued (E)
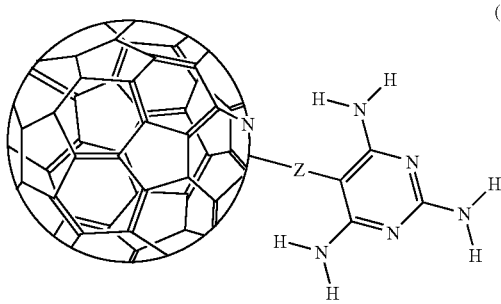

(F)
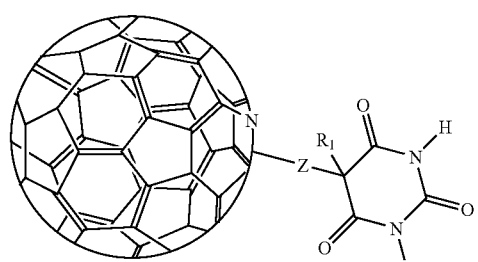

(G)
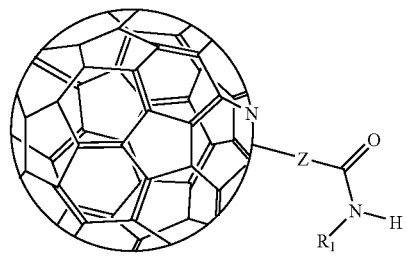

(H)
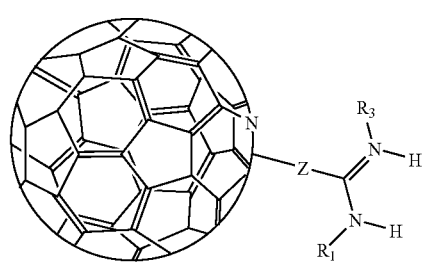

(I)
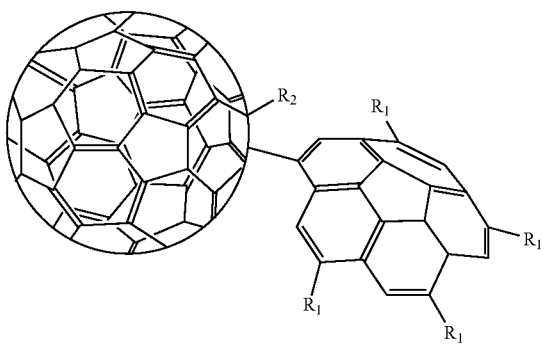

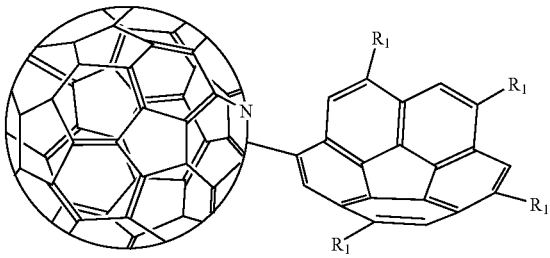

(J)

In formulas (A) through (J), $R_2$ is selected from a variety of small-sized groups, such as hydride group, deuteride group, halo groups, hydroxy group, methyl group, thio group, and metal cations, Z is selected from O, S, $NR_4$, and $CR_5R_6$, and $R_1$, $R_3$, $R_4$, $R_5$, and $R_6$ are independently selected from a variety of groups, such as hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups. Certain fullerene derivatives given by formulas (A) through (J) can exhibit self-assembly through hydrogen bonds between substituent groups of one fullerene molecule and an adjacent fullerene molecule. Referring to formulas (I) and (J), it should be recognized that a variety of concave or bowl-shaped aryl groups can be used to promote self-assembly with an adjacent fullerene molecule, such as groups based on corannulene, substituted corannulenes, and extended corannulenes.

Table 1 below sets forth specific examples of suitable fullerene derivatives according to some embodiments of the invention.

TABLE 1

| Fullerene Derivative | Remarks | Chemical Structure |
|---|---|---|
| 6,9,12,15,18-pentaaryl-1-hydro-$C_{60}$ | R can be any of:<br>1) methyl ("Me"), ethyl ("Et"), n-propyl, i-propyl, n-butyl, s-butyl, i-butyl, n-pentyl, and so forth (in chiraly pure form where appropriate)<br>2) 1-adamantyl, 2-pinenyl, and other cycloalkyls<br>3) groups including substituted alkyls with or without hydrogen-bonding groups, such as $CH_2OMe$, $CH_2CH_2OH$, $CH_2C(=O)NHEt$, $CH_2SEt$, $C(=O)R$, and so forth | |
| 6,9,12,15,18-pentaaryl-1-hydro-$C_{60}$ | $R_1$, $R_2$, $R_3$, $R_4$, and $R_5$ can be different substituent groups, prepared by sequential addition of aryl Grignard or copper(I) reagents to $C_{60}$, for example, by initial formation of an 1-aryl-2-hydro-$C_{60}$ via addition of a Grignard reagent or organolithium reagent to $C_{60}$, then carrying out aryl copper tetra-addition | |

TABLE 1-continued

| Fullerene Derivative | Remarks | Chemical Structure |
|---|---|---|
| 6,9,12,15,18-pentaaryl-1-hydro-C$_{60}$ | X can be any of:<br>1) halo groups (e.g., F, Cl, Br, and I)<br>2) chalcogen-based substituent groups (e.g., O, S, Se, Te)<br>3) Group V element-based substituent groups (e.g., N, P, As, and Sb)<br>4) stable metalloid-based substituent groups (e.g., B, Si, Ge, Sn, and Pb) | 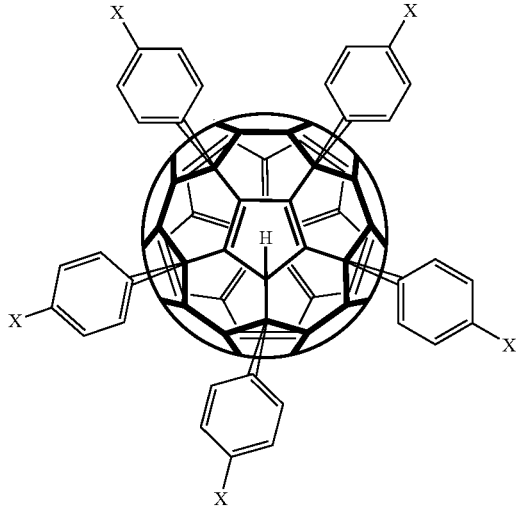 |
| 6,9,12,15,18-pentaaryl-1-R-hydro-C$_{60}$ | 1) 1-hydrogen is replaced with a small-sized group<br>2) 1-hydrogen is deprotonated, and a salt is formed that can promote self-assembly | 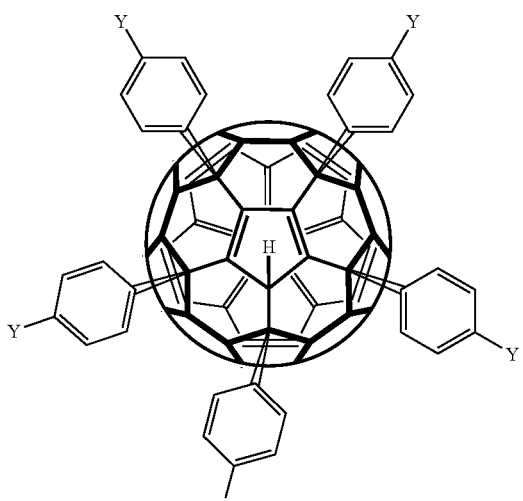<br>Y = any group shown above<br>R = any small group<br>    Me, F, Cl, Br, I, OH, SH<br>R = any metal cation<br>    Li$^+$, Na$^+$, K$^+$, Rb$^+$<br>    Cs$^+$, Cu$^+$, Ag$^+$, Au$^+$, Tl$^+$ |

TABLE 1-continued
| Fullerene Derivative | Remarks | Chemical Structure |
|---|---|---|
| 6,9,12,15,18-pentaaryl-1-hydro-$C_{60}$ | | 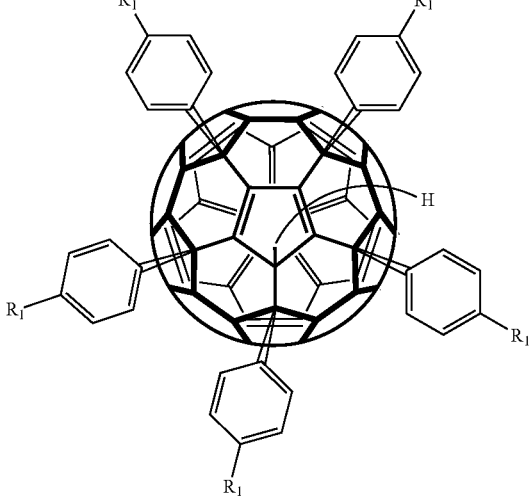<br><br>$R_1$ = heterocycles below<br><br>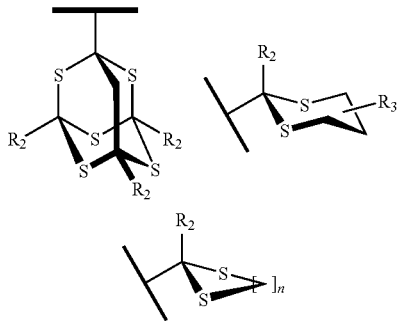<br><br>$R_2$ = H, Me, etc . . .<br>Sulfur-containing rings for increased polarizability and charge transport |
| 6,9,12,15,18-pentaaryl-1-hydro-$C_{60}$ | Ar is any of a variety of stack-promoting polycyclic aryl groups that may or may not be partially hydrogenated | 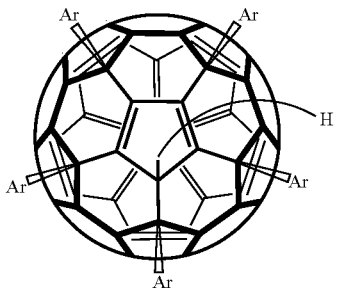 |

TABLE 1-continued

| Fullerene Derivative | Remarks | Chemical Structure |
|---|---|---|
| | | Ar = 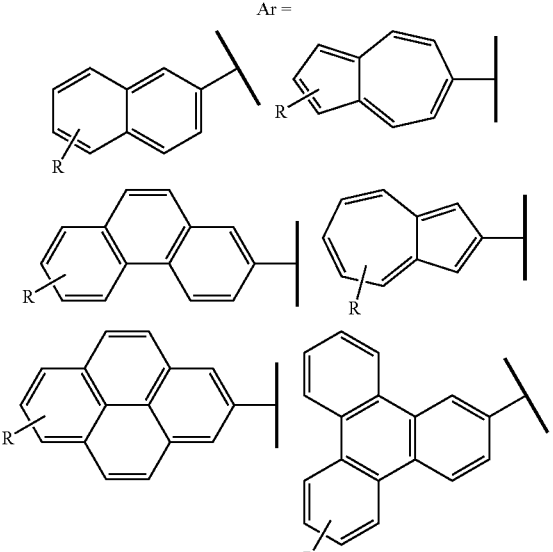 |
| 6,9,12,15,18-pentaaryl-1-hydro-$C_{60}$ | Any substitution on phenyl groups, such as alkyl groups, aryl groups, halo groups, OH, OR, $NH_2$, NHR, NRR', SH, SR, and so forth | |
| 6,9,12,15,18-pentaheteroaryl-1-hydro-$C_{60}$ | Reduce spatial constraints of aryl groups and promote better cavity shape formation by using 5-membered ring instead of 6-membered ring<br>Any 5-membered heteroaryl group with any combination of heteroatoms and substituent groups | 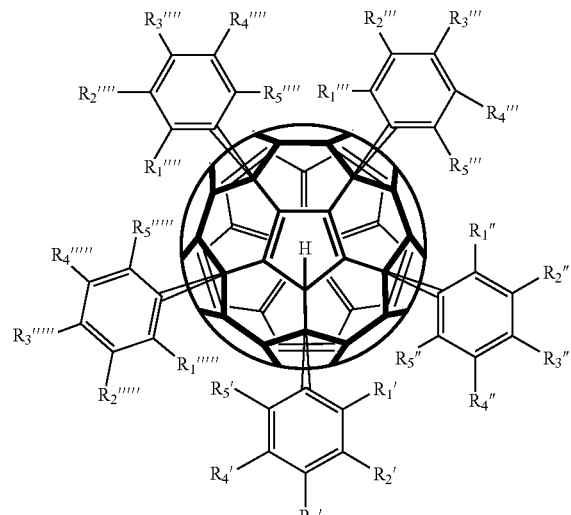<br>Y, Z = O, S, NR, CR |

TABLE 1-continued

| Fullerene Derivative | Remarks | Chemical Structure |
|---|---|---|
| 6,9,12,15,18-pentaheteroaryl-1-hydro-$C_{60}$ | Reduce spatial constraints of aryl groups and promote better cavity shape formation by using 5-membered ring instead of 6-membered ring | 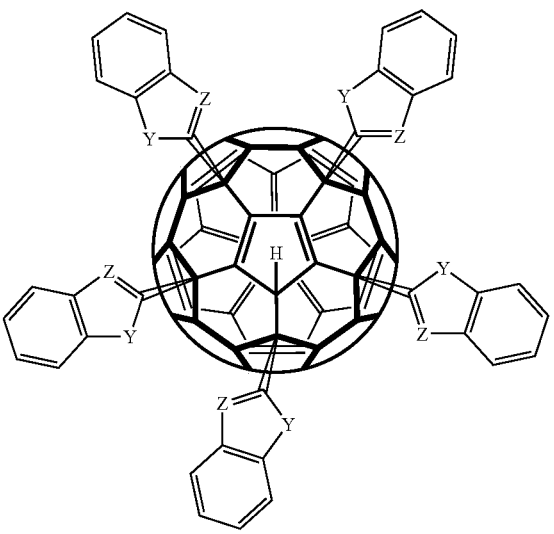<br>Y, Z = O, S, NR |
| 6,9,12,15,18-pentaheteroaryl-1-hydro-$C_{60}$ | Use of intramolecular hydrogen bonding to control shape of cavity, in addition to reducing spatial constraints of aryl groups and promote better cavity shape formation by using 5-membered ring instead of 6-membered ring | 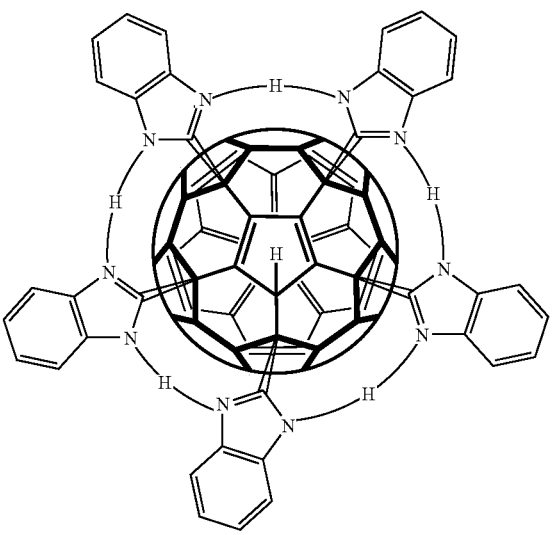<br>Benzimidazolyl |
| 1,9-epoxy-6,12,15,18-tetraaryl-$C_{60}$ | Reduced number of aryl groups can form a cavity with a large cleft to promote self-assembly | 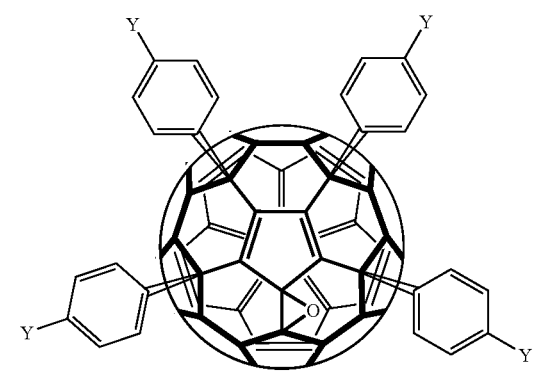<br>Y = any group shown above |

TABLE 1-continued

| Fullerene Derivative | Remarks | Chemical Structure |
| --- | --- | --- |
| 1,9-dihydroxy-6,12,15,18-tetraaryl-$C_{60}$ | Dihydroxylated by ring-opening of epoxide | 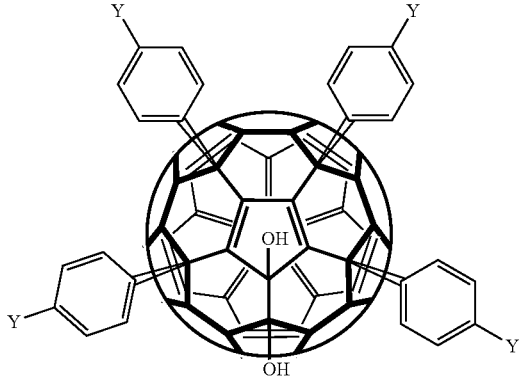<br>Y = any group shown above |
| 6,12,15,18-tetraaryl-$C_{60}$ | Reduced number of aryl groups can form a cavity with a large cleft to promote self-assembly | 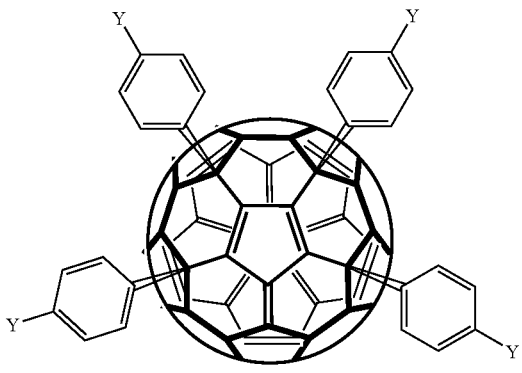<br>Y = any group shown above |
| 6,9,12,15,18-pentaalkynyl-1-hydro-$C_{60}$ | Use of highly-polarizable alkynyl groups to:<br>1) reduce steric constraints of cavity-shaping groups, thereby promoting closer proximity of stacked fullerene molecules<br>2) promote stacking through van der Waals interactions of alkynyl groups with stacked fullerene molecules<br>3) enhance electronic interactions of stacked fullerene molecules by homoconjugation of fullerene π-system with alkyne π-system and adjacent fullerene π-system<br>$R_1$ can be any of:<br>1) Me, t-butyl, and other alkyl groups<br>2) silyl groups and tin-based substituent groups<br>3) alkynyl groups<br>4) aryl groups | 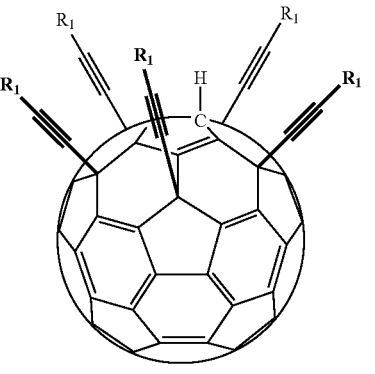 |

TABLE 1-continued

| Fullerene Derivative | Remarks | Chemical Structure |
|---|---|---|
| 6,9,12,15,18-pentaalkynyl-1-$R_2$-$C_{60}$ | $R_1$ can be any of:<br>1) Me, t-butyl, and other alkyl groups<br>2) silyl groups and tin-based substituent groups<br>3) alkynyl groups<br>4) aryl groups<br>$R_2$ can be any of:<br>1) H and D<br>2) any small group: Me, F, Cl, Br, I, OH, and SH<br>3) any metal cation: $Li^+$, $Na^+$, $K^+$, $Rb^+$, $Cs^+$, $Cu^+$, $Ag^+$, $Au^+$, and $Tl^+$ | |
| 6,9,12,15,18-pentaaryl-1-aza-$C^{60}$ | Any substitution on phenyl groups, such as alkyl groups, aryl groups, halo groups, OH, OR, $NH_2$, NHR, NRR', SH, SR, and so forth<br>Reduce inter-fullerene distance with lesser steric constraints of 1-nitrogen (instead of CH) | |
| 6,9,12,15,18-pentaalkynyl-1-aza-$C_{60}$ | $R_1$ can be any of:<br>1) Me, t-butyl, and other alkyl groups<br>2) silyl groups and tin-based substituent groups<br>3) alkynyl groups<br>4) aryl groups<br>Reduce inter-fullerene distance with lesser steric constraints of 1-nitrogen (instead of CH) | |
| 6,9,12,15,18-penta-substituted 1-aza-$C_{60}$ | $R_1$, $R_2$, $R_3$, $R_4$, and $R_5$ can be independently selected from a variety of stack-promoting substituent groups, such as alkynyl groups, and aryl groups<br>Reduce inter-fullerene distance with lesser steric constraints of 1-nitrogen (instead of CH) | |

TABLE 1-continued

| Fullerene Derivative | Remarks | Chemical Structure |
|---|---|---|
| 6,9,12,15,18-pentaheteroaryl-1-aza-$C_{60}$ | Reduce spatial constraints of aryl groups and promote better cavity shape formation by using 5-membered ring instead of 6-membered ring<br>Any 5-membered heteroaryl group with any combination of heteroatoms and substituent groups<br>Reduce inter-fullerene distance with lesser steric constraints of 1-nitrogen (instead of CH) | 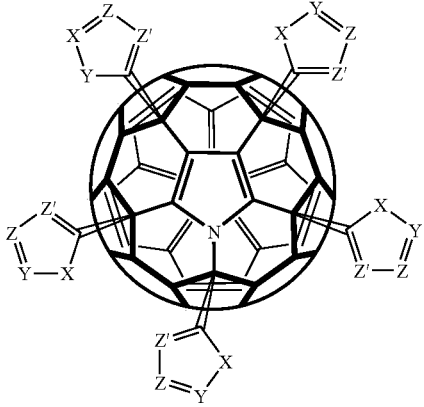<br>Y, Z = O, S, NR, CR |
| 6,9,12,15,18-pentaheteroaryl-1-aza-$C_{60}$ | Reduce spatial constraints of aryl groups and promote better cavity shape formation by using 5-membered ring instead of 6-membered ring<br>Reduce inter-fullerene distance with lesser steric constraints of 1-nitrogen (instead of CH) | 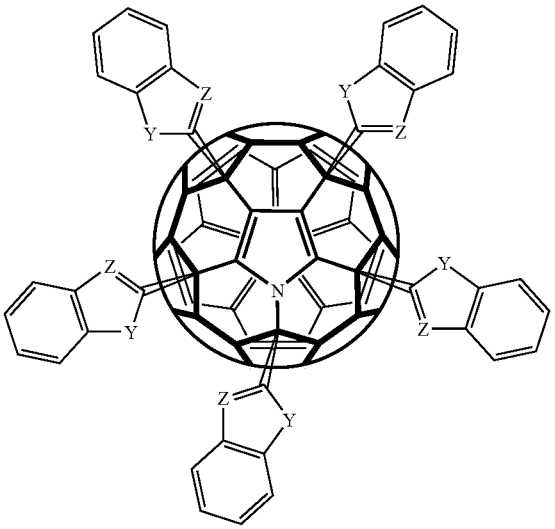<br>Y, Z = O, S, NR |
| 6,9,12,15,18-pentaheteroaryl-1-aza-$C_{60}$ | Use of intramolecular hydrogen bonding to control shape of cavity, in addition to reducing spatial constraints of aryl groups and promote better cavity shape formation by using 5-membered ring instead of 6-membered ring<br>Reduce inter-fullerene distance with lesser steric constraints of 1-nitrogen (instead of CH) | 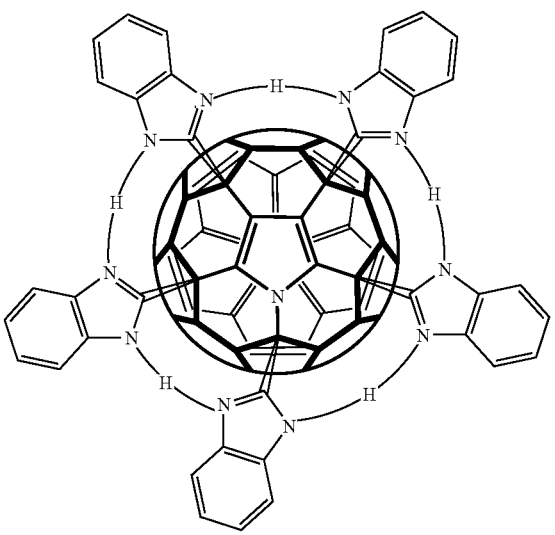<br>Benzimidazolyl |

TABLE 1-continued

| Fullerene Derivative | Remarks | Chemical Structure |
|---|---|---|
| Higher fullerene derivatives | Any higher fullerene, such as $C_{70}$, $C_{76}$, or $C_{84}$, with any combination of substituent groups to promote self-assembly | 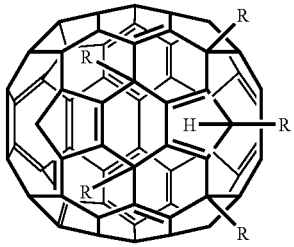 |
| Endohedral metallofullerenes | Any higher endohedral metallofullerene complex, such as $C_{70}$, $C_{76}$, or $C_{84}$, with any combination of substituent groups to promote self-assembly | Any pentaryl adduct of Ln@$C_{76}$, Ln@$C_{78}$, Ln@$C_{82}$ (Ln = Y, Sc, La, Ce, Pr, Nd, Pm, Sm, Eu, Gd, Tb, Dy, Ho, Er, Tm, Yb), $La_2$@$C_{72}$, $Sc_2$@$C_{74}$, $La_2$@$C_{80}$, $Ce_2$@$C_{80}$, $Sc_2$@$C_{82}$, $Sc_2$@$C_{84}$, $Sc_3$@$C_{82}$, $Sc_3N$@$C_{80}$, or alkaline-earth metals endohedrals (e.g., M@$C_{72}$, M@$C_{74}$, M@$C_{80}$, M@$C_{82}$, M@$C_{84}$, M = Ca, Sr, Ba) |

In addition to self-assembly, another consideration for fullerene derivatives is their solubility in organic solvents or in a blended solution with a semiconducting polymer. In some instances, a propensity of a fullerene derivative to self-assemble can lower its solubility. For example, as fullerene molecules in a solution self-assemble into one-dimensional columns of increasing lengths, significant attractive interactions can develop between the columns, causing their precipitation out of solution. To improve a solubility of a fullerene derivative, it can be desirable to control a length or other extent of a packing structure, without overly disrupting short-range interactions that lead to self-assembly in the first place. Along this regard, a combination of different fullerene derivatives can be used: one of which is selected for its propensity to self-assemble, and another of which is selected to control an extent of a resulting packing structure. In particular, molecules of the latter fullerene derivative can serve as stopper molecules that can be added at terminal portions of a packing structure, such as at one end of a column but not the other end. By including a small amount of stopper molecules of one fullerene derivative into a solution of another fullerene derivative, such as with a molar ratio in the range of about 1:1000 to about 1:10 or in the range of about 1:500 to about 1:100, effective control can be achieved over an extent of a resulting packing structure.

Figure 8:
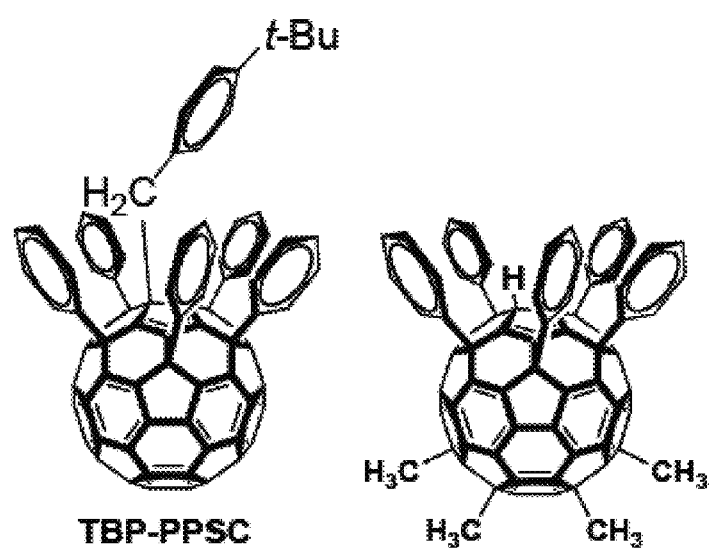
FIG. 8 illustrates examples of stopper molecules implemented in accordance with some embodiments of the invention.

According to an embodiment of the invention, a suitable fullerene derivative to provide stopper molecules is given by formula (II) above, where R is instead selected from a variety of relatively bulky substituent groups to prevent another fullerene molecule from adding to a packing structure, such as alkyl groups, alkenyl groups, alkynyl groups, and aryl groups. For example, R can be —$CH_2R'$, where R' is selected from alkenyl groups, alkynyl groups, and aryl groups. According to another embodiment of the invention, a stopper molecule includes one set of substituent groups that form a cavity or a cup at one side of a fullerene bowl and another set of relatively bulky substituent groups at another side of the fullerene bowl, the latter of which prevent another fullerene molecule from adding to a packing structure. FIG. 8 illustrates examples of stopper molecules implemented in accordance with some embodiments of the invention.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation of Fullerene Derivatives and Photovoltaic Devices

Figure 2:
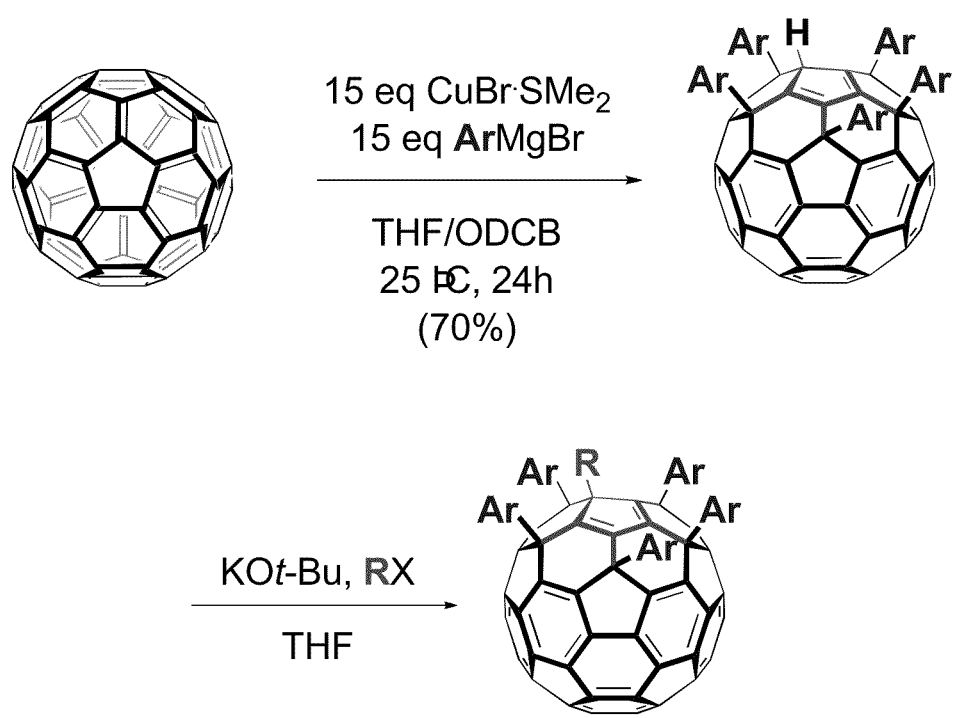
FIG. 2 illustrates a procedure to form a fullerene derivative, according to an embodiment of the invention.
Figure 3:
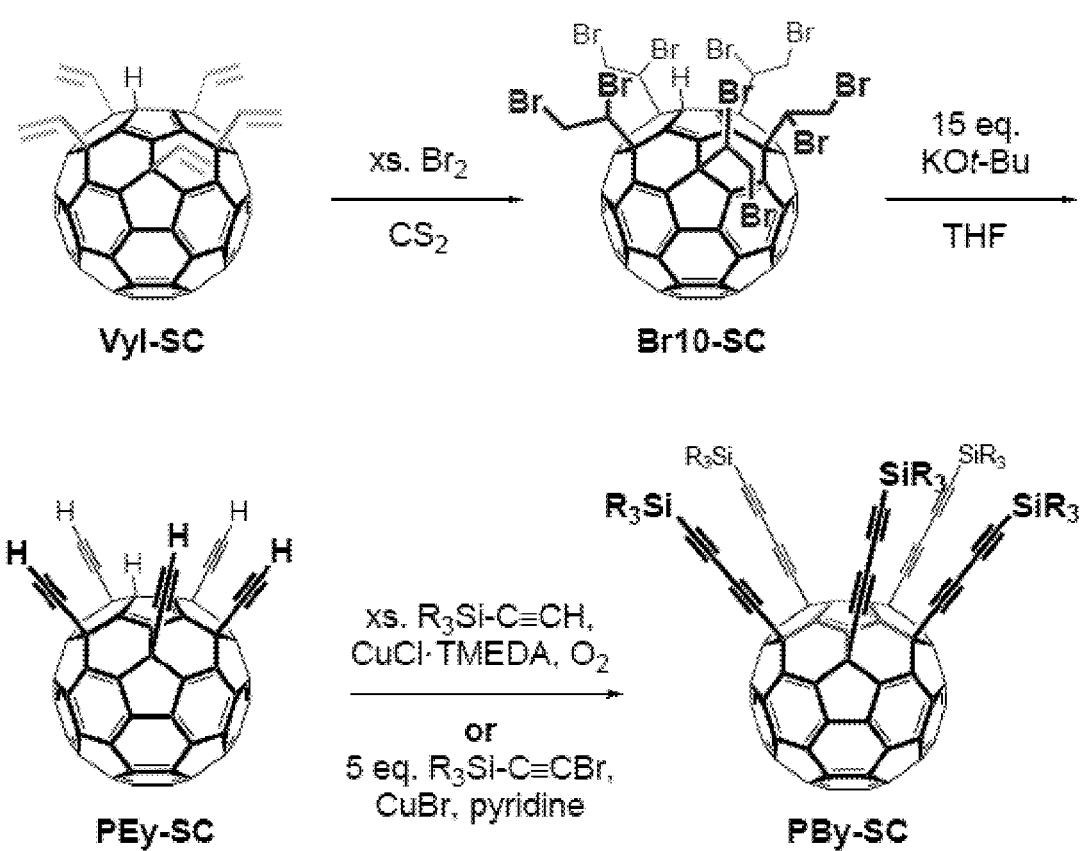
FIG. 3 illustrates another procedure to form a fullerene derivative, according to an embodiment of the invention.

Certain self-assembling fullerene derivatives were formed following a similar procedure as set forth in FIG. 2. A representative example is as follows. The following procedure was carried out under an argon atmosphere. A solution of 4-t-butylbromobenzene (1.775 g, 8.330 mmole) in tetrahydrofuran ("THF") (15 ml) was added to a suspension of magnesium turnings (0.400 g, 16.454 mmole) in THF (2 ml) at a rate sufficient to sustain reflux (over 15 min). The solution was refluxed for a further 30 minutes and then allowed to cool to room temperature. The solution was then added to a suspension of $CuBr.SMe_2$ (1.712 g, 8.330 mmole) in THF (2 ml) at −78° C. over 10 min. After stirring at −78° C. for 15 min, a solution of $C_{60}$ (0.500 g, 0.694 mmole) in o-dichlorobenzene (60 ml) was added over 15 min at −78° C., forming a deep green color, and a resulting solution was allowed to warm to room temperature and stirred over night. A resulting dark red-brown reaction mixture was treated with saturated aqueous ammonium chloride (0.5 ml) and filtered through a wide silica pad (5×2 cm). Toluene was washed through the silica pad until the filtrate was colorless (200 ml), and the combined filtrates were evaporated under high vacuum below 70° C. A resulting residue was purified by flash column chromatography on silica gel using neat $CS_2$ as an eluent. A bright orange-red fraction was evaporated to dryness, redissolved in a small volume of $CS_2$, precipitated from pentane, and centrifuged. A pale orange supernatant was discarded, and the precipitation cycle was repeated another two times, using sonication to dissolve the solid. An amorphous orange-red solid was dried under high vacuum and corresponded to a fullerene derivative.

The fullerene derivative was then blended with a semiconducting polymer in solution, using an organic solvent such as chlorobenzene or o-dichlorobenzene. The blended solution was used to form a thin film of an intimate blend of the polymer and the fullerene derivative using a spin coating technique. In particular, the blended solution was deposited on an electrode surface to form an active layer, and another electrode was formed either by thermal evaporation or sputtering. One of the electrodes was semi-transparent to allow absorption of incident light by the active layer. In particular, a semi-transparent, ITO layer covered by a PEDOT:PSS layer served as an anode, and a thin layer of aluminum served as a cathode.

Example 2

Figure 4:
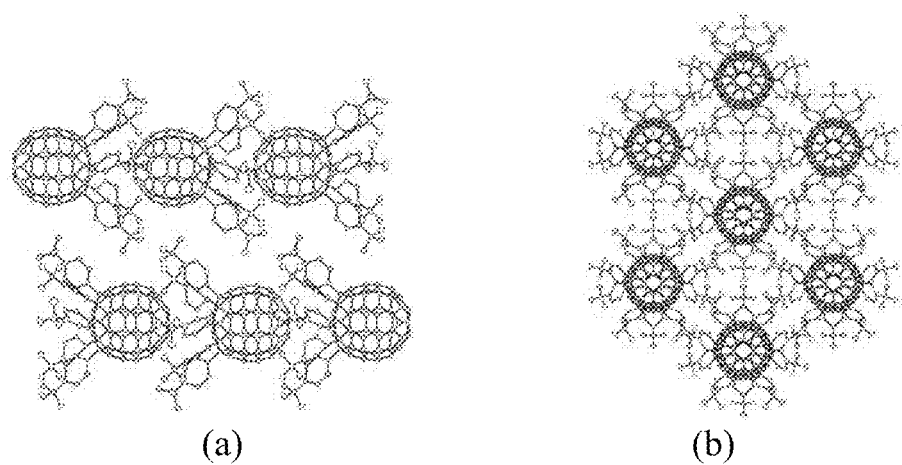
FIG. 4 illustrates a packing structure of 6,9,12,15,18-penta-(p-t-butylC$_6$H$_4$)-1-hydro-C$_{60}$, according to an embodiment of the invention.

Formation and Characterization of Fullerene Derivatives and Photovoltaic Devices Following a similar procedure as set forth in FIG. 2, a fullerene derivative, namely 6,9,12,15,18-penta-(p-t-butylC$_6$H$_4$)-1-hydro-C$_{60}$ and hereinafter in this example referred as derivative A, was obtained as a bright red solid and purified by column chromatography on a silica gel. FIG. 4 illustrates a packing structure of derivative A.(C$_5$H$_{12}$)$_3$ obtained by slow diffusion of n-pentane into a saturated solution of derivative A in 1-chloronaphthalene. In particular, FIG. 4a illustrates the packing structure viewed along a bc plane, while FIG. 4b illustrates the packing structure viewed along an a-axis. As can be appreciated, derivative A forms one-dimensional columns or stacks that are aligned anti-parallel and separated by sheaths of n-pentane molecules. A distance between fullerene centroids within each column is about 10.83 Å, and shortest distances between fullerene centroids in adjacent columns are about 14.85 Å and about 15.86 Å. Upon examination of crystal structures of derivative A crystallized from o-dichlorobenzene, CS$_2$, and chlorobenzene derivative A was deemed to be an "universal stacker" or a "robust stacker," with resulting crystals displaying a packing structure characterized by assembly of one-dimensional fullerene stacks that are substantially solvent-independent. For the four solvents that were examined, the overall packing structure is substantially dictated by self-assembly of the one-dimensional stacks, with solvent molecules filling into voids.

Figure 5:
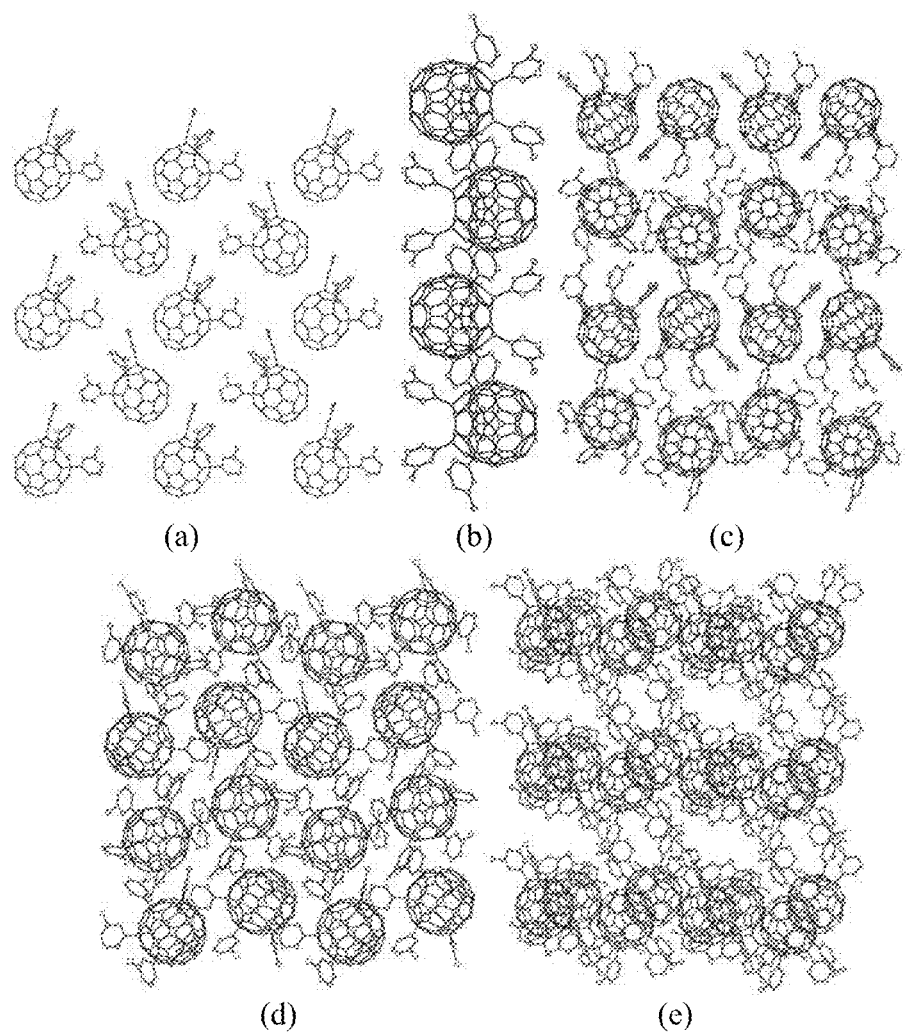
FIG. 5 illustrates packing structures of 6,9,12,15,18-penta-(m-methylC$_6$H$_4$)-1-hydro-C$_{60}$ formed from different solvent systems, according to an embodiment of the invention.

Because a reduction of a local symmetry of a substituent group tends to increase overall molecular solubility, another fullerene derivative was also investigated, namely 6,9,12,15,18-penta-(m-methylC$_6$H$_4$)-1-hydro-C$_{60}$ and hereinafter in this example referred as derivative B. The solubility of derivative B in o-dichlorobenzene is about 10 mg/mL, which is high enough for manufacturing of photovoltaic devices by spin coating from a concentrated solution of this fullerene derivative nixed with P3HT. Crystals suitable for single crystal X-ray diffraction were formed from five different solvent systems, resulting in different extended crystal structures as illustrated in FIG. 5. FIG. 5a and FIG. 5b illustrate a packing structure of derivative B.CHCl$_3$ formed from a concentrated solution in a CHCl$_3$/CS$_2$ mixture, for an ac layer viewed along a b-axis and for a single b-axis chain, respectively. Chloroform molecules reside just within a cavity formed by the five m-tolyl groups, and fullerene-solvent units form a close-packed three-dimensional, diamond-like network in which each fullerene molecule has four nearest-neighbors arranged in an approximately tetrahedral geometry. Fullerene centroid-centroid distances are about 10.436 Å for edge-vertex close contacts (see FIG. 5a) and about 9.894 Å for hexagon-hexagon contacts (see FIG. 5b), respectively. A substantially identical packing motif was observed in the crystal structure of derivative B.CS$_2$, formed by slow diffusion of n-pentane into a CS$_2$ solution of derivative B. In contrast, derivative B.o-dichlorobenzene forms a layered structure, as illustrated in FIG. 5d for a single bc layer viewed along an a-axis and FIG. 5e for multiple bc layers viewed along a b-axis. Although co-crystallized o-dichlorobenzene molecules reside just within a cavity in a similar fashion to derivative B.CHCl$_3$, alternating layers of fullerene molecules and solvent molecules are observed with a periodicity of about 16.55 Å (see FIG. 5e). Fullerene molecules within each layer are approximately hexagonally packed, and each fullerene molecule has five nearest-neighbors and with fullerene centroid-centroid distances ≤10.193 Å. A substantially identical packing motif was observed for derivative B.C$_6$H$_5$CH$_3$ formed by slow evaporation of C$_6$H$_5$CH$_3$. However, the crystal structure of derivative B.(C$_6$H$_5$Cl)$_{1.875}$ is different, with each fullerene molecule having three nearest-neighbors and with fullerene centroid-centroid distances ≤10.318 Å, forming a layered, puckered, honeycomb network as illustrated in FIG. 5c. These diverse packing structures indicate that derivative B does not tend to form one dimensional stacks, and can be used for comparison purposes as an example of a non-stacking fullerene derivative.

As can be appreciated with reference to FIG. 4 and FIG. 5, the packing structure of derivative A contrasts with that of derivative B, in which subtle changes in solvents used produced different packing motifs. This difference can be at least partly understood on the basis of molecular shape: a deeper cavity of derivative A resulting from para-substituted phenyl arms promotes efficient one-dimensional stacking, while meta-substituted phenyl arms of derivative B form a shallow cavity.

An ideal BHJ photovoltaic device desirably includes two networks that are both substantially continuous and substantially interconnected throughout a thickness of an active layer. For a polymer/fullerene-based BHJ photovoltaic device, a fullerene derivative with a propensity to form one-dimensional stacks can yield such desirable networks. Along this regard, BHJ photovoltaic devices were formed from blends of either derivative A or derivative B with P3HT. It is expected that robust stacking and non-stacking packing motifs observed in single crystal forms of derivative A and derivative B also are present, at least to certain extent, in the resulting photovoltaic devices.

Current density-voltage (I-V) characteristics of as-cast P3HT:derivative A (1:0.35 blend) and P3HT:derivative B (1:0.45 blend) devices under simulated AM1.5 solar irradiation are illustrated in FIG. 6a and FIG. 6b, respectively. The I-V curves indicate that both a short-circuit current density ($I_{sc}$) and an open-circuit voltage ($V_{oc}$) are larger for the devices formed from derivative A. The larger value of $I_{sc}$ for derivative A is consistent with this fullerene derivative forming a more interconnected network compared to derivative B. It is expected that the difference in $V_{oc}$ is related to nanometer-scale morphology of fullerene networks. One potential explanation is that different fullerene networks can have different densities of charge carrier traps, which can contribute to space-charge buildup and can affect built-in potentials in the devices. Another potential explanation is that different fullerene aggregation geometries can affect self-assembly or crystallinity of P3HT, with a change in the crystallinity or average conjugation length affecting a spatially averaged highest occupied molecular orbital of the polymer and, thus, affecting $V_{oc}$.

Figure 6:
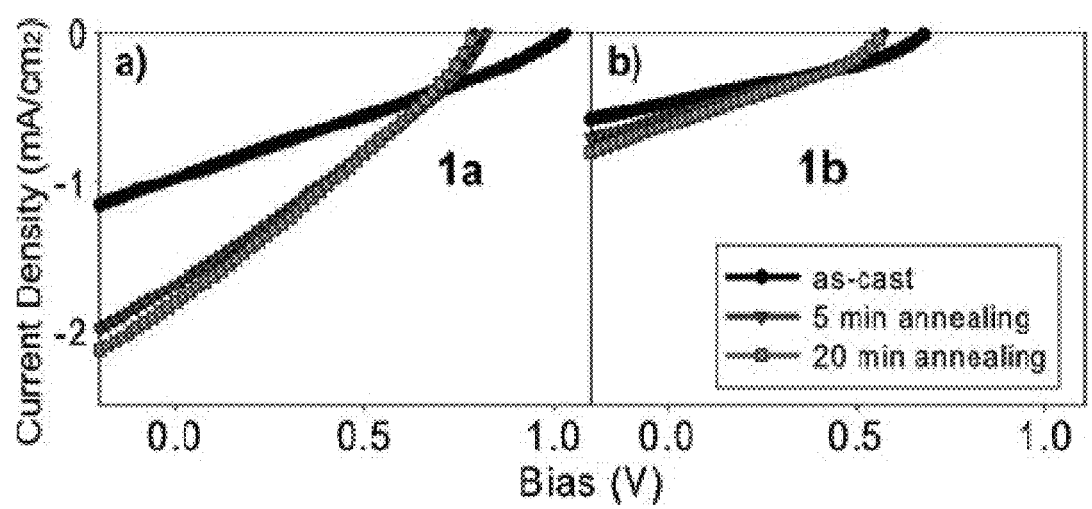
FIG. 6 illustrates current density-voltage (I-V) characteristics of photovoltaic devices formed from 6,9,12,15,18-penta-(p-t-butylC$_6$H$_4$)-1-hydro-C$_{60}$ and 6,9,12,15,18-penta-(m-methylC$_6$H$_4$)-1-hydro-C$_{60}$, according to an embodiment of the invention.

Since thermal annealing can improve efficiencies of conventional polymer-based photovoltaic devices, photovoltaic devices formed from blends of P3HT with derivative A or derivative B were subjected to annealing conditions similar to those used for P3HT:[6,6]-phenyl-C$_{61}$-butyric acid methyl ester photovoltaic devices. As with conventional devices, annealing the devices formed from derivative A and derivative B decreased $V_{oc}$ but increased $I_{sc}$, leading to an overall increase in efficiency as illustrated in FIG. 6. The reduction in $V_{oc}$ can be attributed to reduced space-charge buildup, while the increase in $I_{sc}$ can be attributed to improved network formation. The annealing-induced increase in $I_{sc}$, which is a direct indicator of an underlying network structure, was observed to be less than half as large for derivative B as compared to derivative A. Since electronic structures of these two fullerene derivatives are substantially identical, the larger improvement in performance upon annealing the devices formed from derivative A can be attributed to an increased self-assembly propensity of derivative A.

For conventional polymer-based photovoltaic devices, thermal annealing can be a kinetically slow process that involves diffusive motion of molecules. For example, P3HT:[6,6]-phenyl-$C_{61}$-butyric acid methyl ester devices can exhibit a steady improvement in performance with thermal annealing for about 20 min, after which the improvement plateaus. This improvement typically is not observed for conventional devices that have been subjected to "solvent annealing," such as by casting from slow-evaporating solvents such as o-dichlorobenzene. In contrast for the devices formed from derivative A and derivative B, thermal annealing has a pronounced effect on the devices cast out of o-dichlorobenzene. Moreover, this thermally induced improvement occurs quickly: for the devices formed from derivative A and derivative B, no further improvement in performance is produced after 5 min of annealing (see FIG. 6). In contrast to conventional devices, performance of the devices formed from derivative A was relatively insensitive to the amount of the fullerene component, namely derivative A. This indicates that there are qualitative differences in both the degree and nature of phase segregation relative to conventional devices.

Thermal annealing can improve efficiency of a polymer-based photovoltaic device by increasing a crystallinity of a polymer component, thus improving hole mobility in the device. Annealing can also promote phase segregation, which can either enhance electron mobility due to improved fullerene-fullerene contacts or decrease electron mobility as phase segregation forms islands within a fullerene network. The strong propensity of derivative A to form one-dimensional stacks regardless of solvent conditions indicates that this fullerene derivative can be less likely to form islands or other unconnected structures upon thermal annealing. In contrast, fullerene derivatives, such as derivative B, that tend to aggregate into more isotropic structures can be more likely to form undesirable phase segregation. Moreover, packing of polymer chains can be dependent on a nanometer-scale morphology of a fullerene derivative, so that the propensity of derivative A to stack in a columnar motif can be conducive to improved polymer π-π interactions and, thus, can lead to higher hole mobility.

Resulting solar conversion efficiencies of the photovoltaic devices formed from derivative A reached up to about 1.5 percent. Further improvements in efficiency can be achieved by optimizing processing conditions such as polymer-fullerene weight ratio, type of solvent, and spin coating conditions. Improvements in efficiency can also be achieved by optimization of contacts between fullerene molecules within a solid-state packing of the molecules. [6,6]-phenyl-$C_{61}$-butyric acid methyl ester has relatively short fullerene C—C contact distances, as observed for crystal structures in chlorobenzene (≥2.902 Å) and in o-dichlorobenezene (≥3.171 Å). This high degree of contact can promote electron mobility. Even with the high propensity of derivative A to form columnar stacks, the closest fullerene-fullerene contacts in crystal structures are longer (≥4.035 Å, derivative A.$(C_5H_{12})_3$). This can be attributed both to a repulsive interaction between meta-phenyl hydrogen atoms of shuttlecock "feathers" with a neighboring fullerene ball, which can hinder a closer approach of molecules within a stack, and to an interstack steric crowding by the "feathers," which can hinder a closer approach of molecules within different stacks. Crystal structures for other fullerene derivatives, such as other penta-substituted fullerene derivatives, can be formed to simultaneously enhance a propensity for self-assembly, reducing fullerene-fullerene contact distances, and optimizing a degree of phase segregation with semiconducting polymers.

Example 3

Characterization of Fullerene Derivatives and Photovoltaic Devices

Tapping mode Atomic Force Microscopy ("AFM") images were obtained for the stacking shuttlecock 6,9,12,15,18-penta-(p-t-butyl$C_6H_4$)-1-hydro-$C_{60}$ blended in a 1:1 weight ratio with P3HT. In an as-cast film, the two components of the polymer-fullerene film appeared well-blended. Upon annealing, fullerene molecules reorganized within the polymer matrix, such that phase segregation of the polymer and long, wire-like fullerene domains were observed. The AFM images indicate that the stacking fullerene derivative forms linear aggregates within the bulk film upon annealing, which indicates that self-assembly of the fullerene derivative is robust enough to occur within the polymer matrix. The one-dimensional fullerene domains observed in the AFM images are about 10 nm taller than a surrounding surface, and range in length from about 500 nm to upwards of 2 μm in length. Self-assembly of the fullerene derivative preferentially along a particular direction can yield significant enhancement in charge transport and collection. Improvement in performance of photovoltaic devices upon formation of linear aggregates is evident in an increase in an open-circuit voltage and an increase in an overall conversion efficiency.

Example 4

Characterization of Photovoltaic Devices

Figure 7:
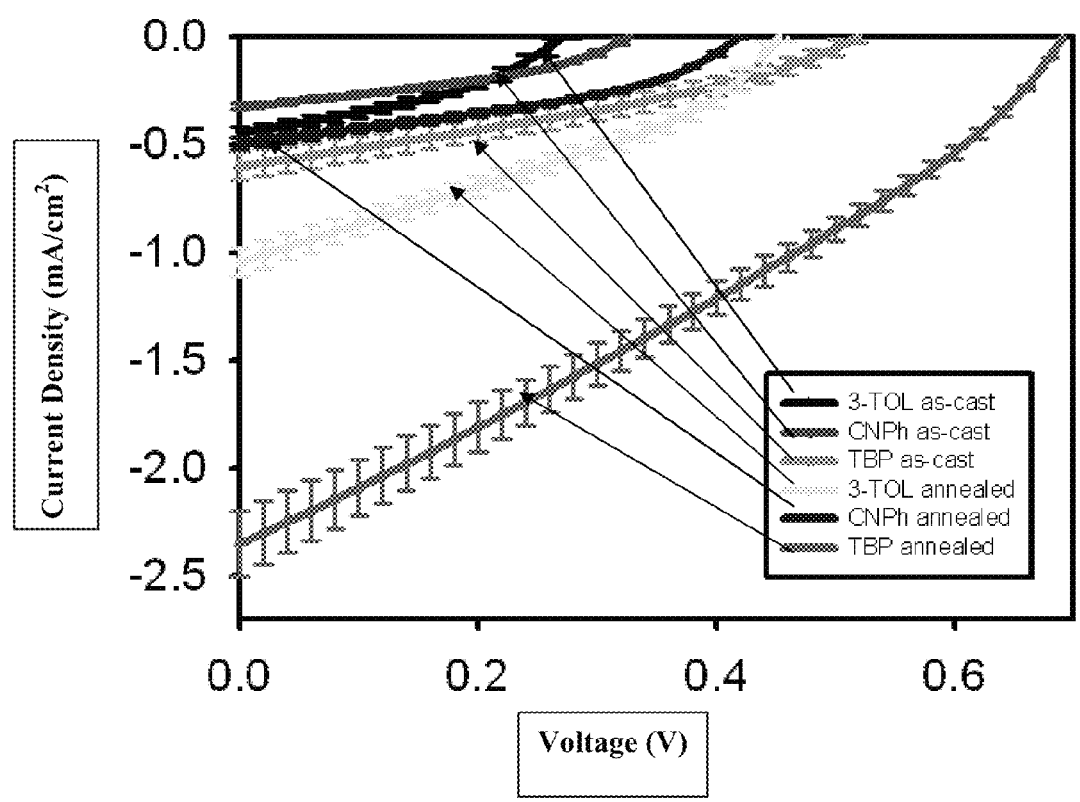
FIG. 7 illustrates I-V curves obtained for photovoltaic devices formed from various fullerene derivatives, according to an embodiment of the invention.

FIG. 7 illustrates I-V curves obtained for photovoltaic devices formed from various fullerene derivatives blended in a 0.67:1 weight ratio with P3HT under AM1.5 illumination. The various curves compare performance of different fullerene derivatives in blended films with and without post-formation treatments. In particular, FIG. 7 illustrates device characteristics of as-cast and thermally annealed blended films for the non-stacking 6,9,12,15,18-penta-(m-phenyl-tolyl)-1-hydro-$C_{60}$ (3-TOL in legend) and for the non-stacking 6,9,12,15,18-penta-(phenyl)-1-cyano-$C_{60}$ (CNPh in legend). In contrast, improved performance of photovoltaic devices formed from blended films of the stacking 6,9,12,15,18-penta-(p-t-butyl$C_6H_4$)-1-hydro-$C_{60}$ (TBP in legend) is also illustrated in as-cast form and annealed form.

Example 5

Formation and Characterization of Fullerene Derivatives

Table 2 below sets forth various stacking fullerene derivatives that were formed following a similar procedure as set forth in FIG. 2. Certain of the fullerene derivatives exhibited solvent-independent, "robust stacking" behavior that is substantially dictated by self-complementary shape of molecules. An example of this stacking behavior is observed for 6,9,12,15,18-penta-(p-t-butylC$_6$H$_4$)-1-hydro-C$_{60}$ (4-TBP-SC in Table 2). A substantially identical columnar stacking motif is observed in crystal structures of 4-TBP-SC.(C$_5$H$_{12}$)$_3$, 4-TBP-SC.(1,2-C$_6$H$_4$Cl$_2$)$_3$, and 4-TBP-SC.(CS$_2$)$_n$, characterized by straight, well-separated stacks. Co-crystallized solvent molecules fill in voids between the stacks. In the case of 4-TBP-SC.(C$_5$H$_{12}$)$_3$, which was formed by slow diffusion of n-pentane into 1-chloronaphthalene, the flexible pentane molecules fit neatly into voids, and relatively little disorder was observed in the crystal structure. 1-chloronapthalene, which has a naturally high affinity for fullerene molecules, was substantially absent from the crystal structure, apparently because the large 1-chloronaphthalene molecules were unable to fit into the voids. In the case of 4-TBP-SC.(1,2-C$_6$H$_4$Cl$_2$)$_3$, the relatively rigid, co-crystallized o-dichlorobenzene molecules are slightly mismatched with the shape of the voids, leading to disorder, whereas, in the case of 4-TBP-SC.(CS$_2$)$_n$, solvent molecules can escape quickly from the channel-like voids, leading to greater disorder.

Other fullerene derivatives fall into a "partially robust stacking" category, where a columnar stacking motif was observed in crystal structures, but variations in the motif occurred across the crystal structures. For example, a crystal structure of the pentaacetal 6,9,12,15,18-penta-(4-CH(OCH$_2$C(CH$_3$)$_2$CH$_2$O)—C$_6$H$_4$)-1-hydro-C$_{60}$ (4-BZPA-SC in Table 2) formed from CS$_2$/n-pentane (4-BZPA-SC.(CS$_2$)$_3$) includes substantially straight stacks with relatively large distances between fullerene molecules within each stack (about 11.37 Å between fullerene centroids), whereas stacks found in crystal structures of 4-BZPA-SC.1-chloronaphthalene, 4-BZPA-SC.toluene, and 4-BZPA-SC.anisole are crooked to varying degrees with smaller within-stack distances (about 10.79 Å, about 10.77 Å, and about 10.79 Å, respectively).

Although large groups at para-positions of phenyl arms tend to promote stacking, these large groups can also sometimes lead to an overall low fullerene density in a solid state. For example, the bulky pentaketal 6,9,12,15,18-penta-(4-CPh(OCH$_2$CH$_2$O)—C$_6$H$_4$)-1-hydro-C$_{60}$.chlorobenzene has a relatively low fullerene density (about $3.82 \times 10^{-4}$ fullerene molecules/Å$^3$) compared to a densely packed, solvent-free stacking fullerene derivative, such as 6,9,12,15,18-penta-(4-SEt-C$_6$H$_4$)-1-hydro-C$_{60}$ (about $6.49 \times 10^{-4}$ fullerene molecules/Å$^3$), and compared to [6,6]-phenyl-C$_{61}$-butyric acid methyl ester.chlorobenzene (about $10.27 \times 10^{-4}$ fullerene molecules/Å$^3$). To improve on performance obtained from 4-TBP-SC-based devices, several fullerene derivatives were formed with smaller groups at para-positions of phenyl arms, with the goal of decreasing both a distance between fullerene molecules within each stack and a distance between stacks. For example, in a solid state, 6,9,12,15,18-penta-(4-OEt-C$_6$H$_4$)-1-hydro-C$_{60}$×CS$_2$ and 6,9,12,15,18-penta-(4-OEt-C$_6$H$_4$)-1-hydro-C$_{60}$×toluene form interdigitated face-to-face dimers with encapsulated solvent molecules. 6,9,12,15,18-penta-(4-Me-C$_6$H$_4$)-1-hydro-C$_{60}$ (4-tol-SC in Table 2) falls into a "confused stacking" category. In particular, crystals formed from 1-chloronaphthalene displayed a similar face-to-face dimer motif, whereas crystals formed from o-dichlorobenzene/pentane displayed a crooked stacking motif.

To achieve intimate stacking while reducing interdigitation, 6,9,12,15,18-penta-(4-i-propyl-C$_6$H$_4$)-1-hydro-C$_{60}$ (4-IP-SC in Table 2) was formed and crystallized from a variety of solvent systems. Although packing motifs present in crystal structures of 4-IP-SC×(chlorobenzene)$_3$ and 4-IP-SC×(1-chloronaphthalene)$_3$ initially placed this fullerene derivative into the "partially robust stacking" category, a different packing motif was observed for 4-IP-SC×(CS$_2$)$_2$, with an i-propyl-phenyl group of one fullerene molecule fitting in a cavity of an adjacent fullerene molecule and placing 4-IP-SC into the "confused stacking" category.

TABLE 2
| Fullerene Derivative | Crystallization Solvent | Chemical Structure | Packing Structure |
|---|---|---|---|
| 4-TBP-SC (robust stacker) | |  | 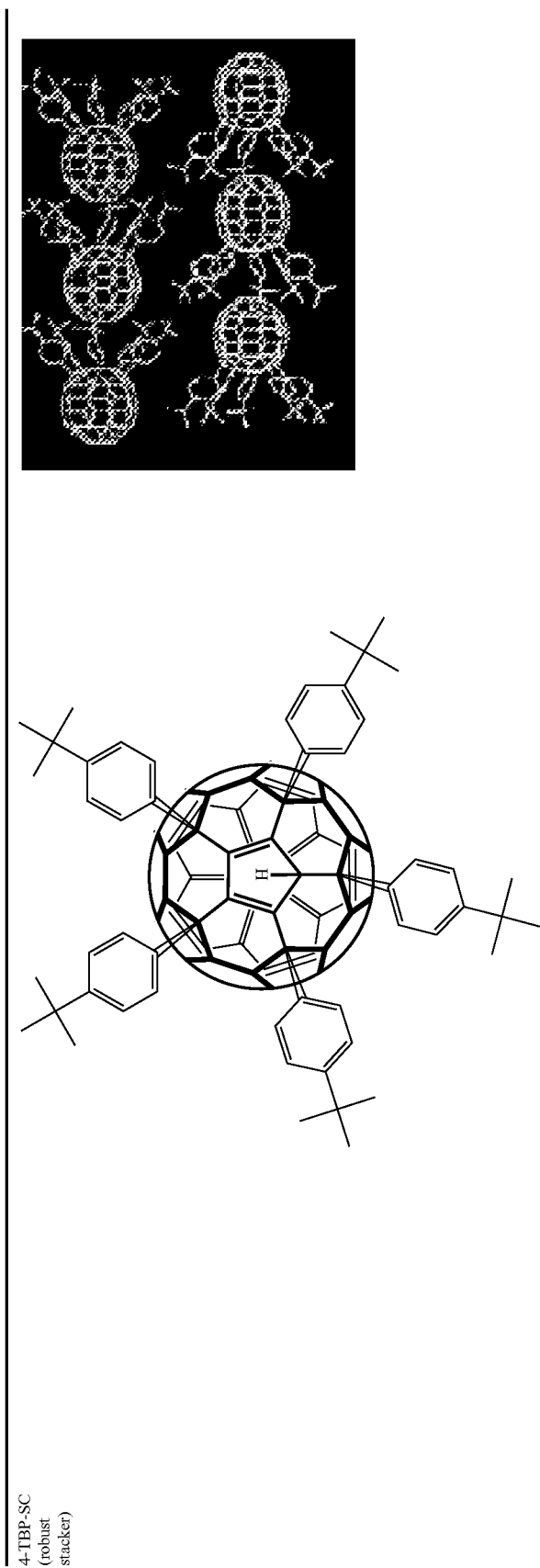 |

TABLE 2-continued

| Fullerene Derivative | Crystallization Solvent | Chemical Structure | Packing Structure |
|---|---|---|---|
| 4-tol-SC (confused stacker) | (1-chloronapthalene/methanol) | | |
| 4-tol-SC (confused stacker) | (o-dichlorobenzene/pentane) | | |

TABLE 2-continued

| Fullerene Derivative | Crystallization Solvent | Chemical Structure | Packing Structure |
|---|---|---|---|
| 4-tol-SC (confused stacker) | (1-chloronapthalene/methanol) | [hexakis(4-methylphenyl)-C60 fullerene structure] | [packing structure image] |

TABLE 2-continued
| Fullerene Derivative | Crystallization Solvent | Chemical Structure | Packing Structure |
|---|---|---|---|
| 2-Np-SC | (CS₂) | 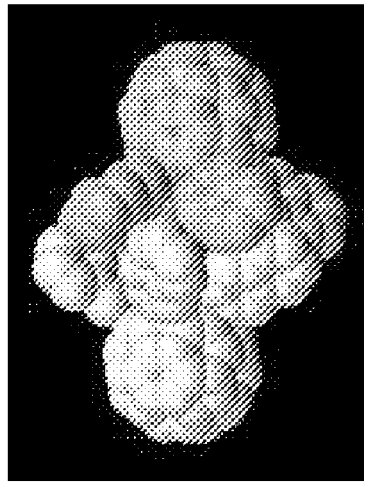 | 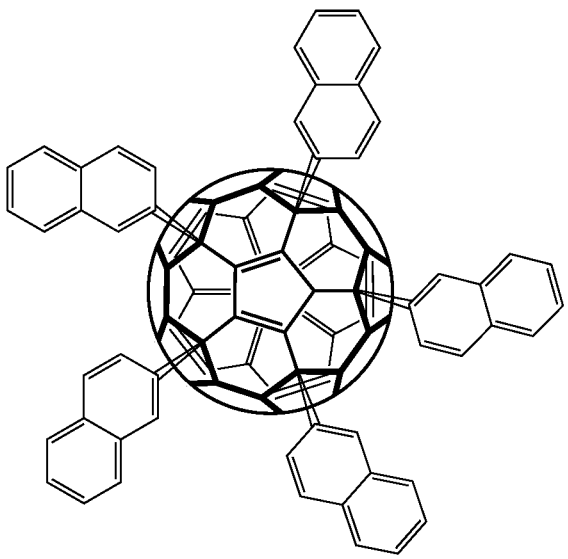 |

TABLE 2-continued
| Fullerene Derivative | Crystallization Solvent | Chemical Structure | Packing Structure |
|---|---|---|---|
| 2-Np-SC | (O-dichlorobenzene) | 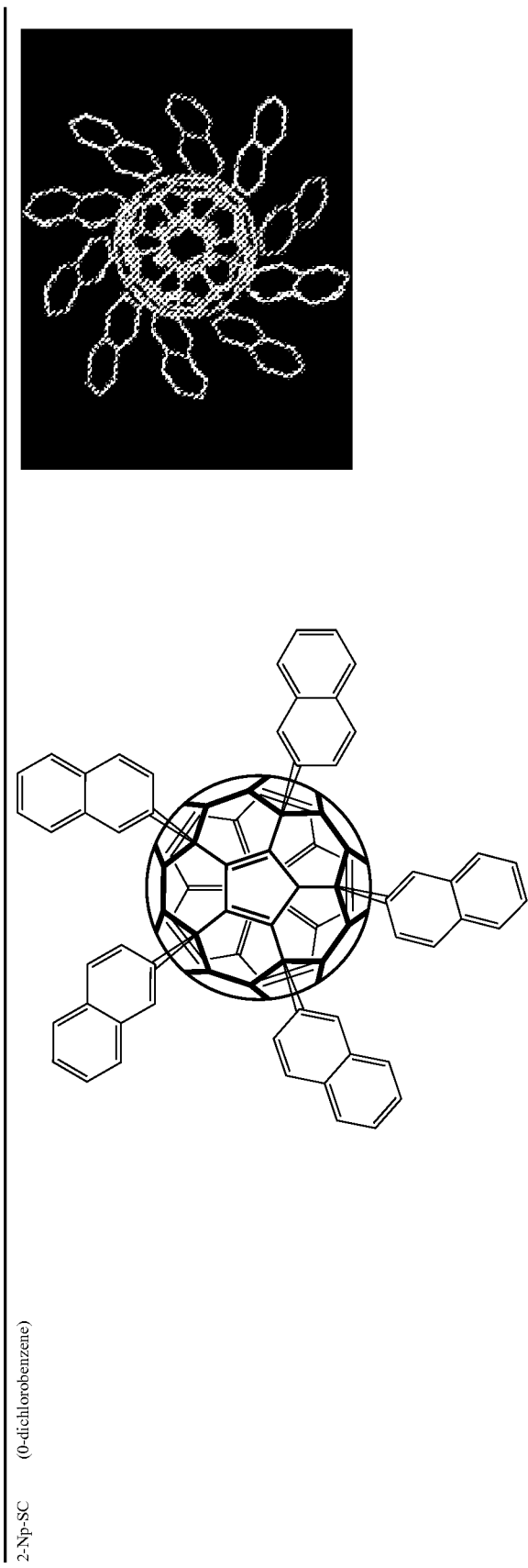 | 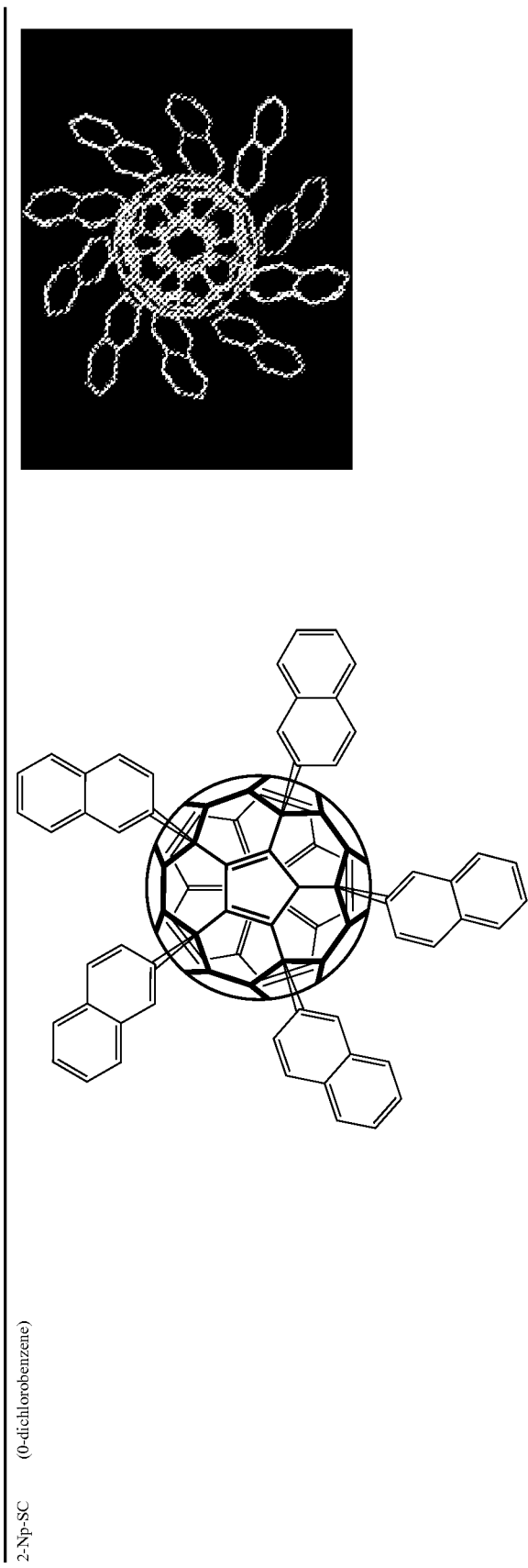 |

TABLE 2-continued
| Fullerene Derivative | Crystallization Solvent | Chemical Structure | Packing Structure |
|---|---|---|---|
| 4-IP-SC (confused stacker) | (CS$_2$) | 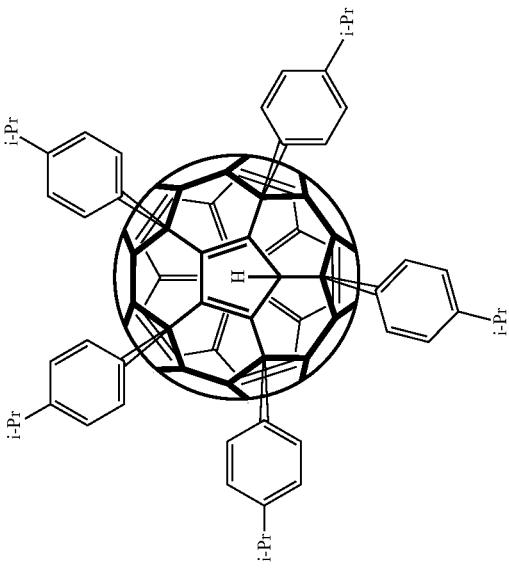 | 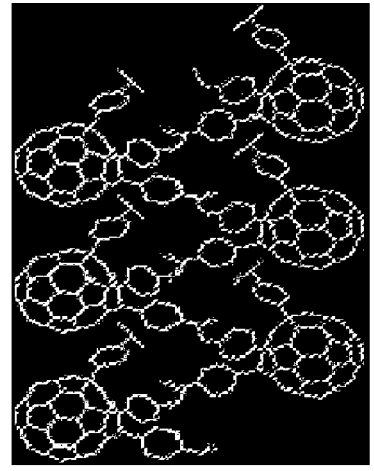 |
| 4-IP-SC (confused stacker) | (chlorobenzene) | 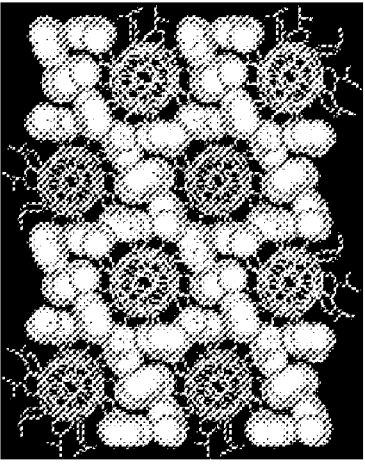 | 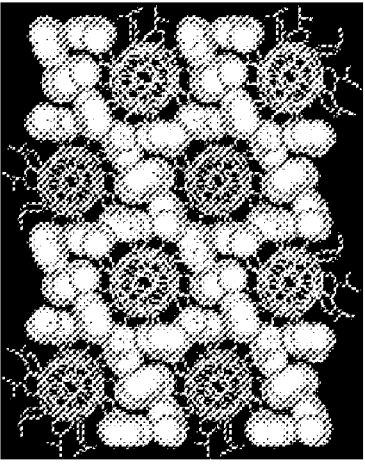 |

TABLE 2-continued
| Fullerene Derivative | Crystallization Solvent | Chemical Structure | Packing Structure |
|---|---|---|---|
| 4-IP-SC (confused stacker) | (1-dichloronapthalene) | 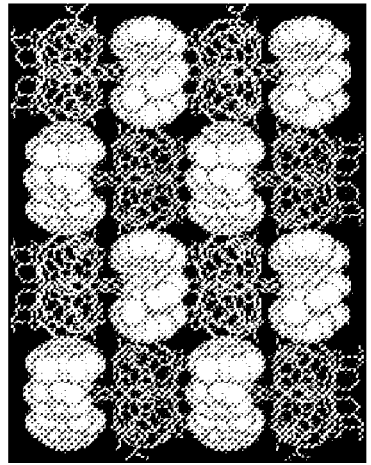 | 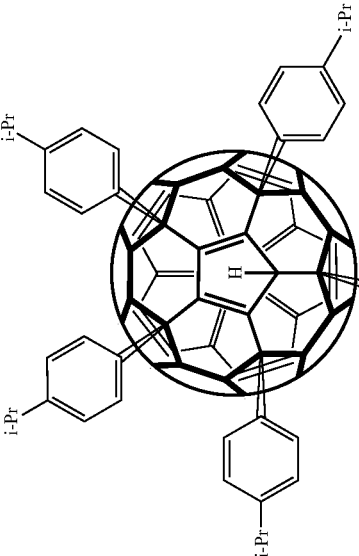 |

TABLE 2-continued

| Fullerene Derivative | Crystallization Solvent | Chemical Structure | Packing Structure |
|---|---|---|---|
| 4-TBBP-SC | (CS$_2$) | | |

TABLE 2-continued
| Fullerene Derivative | Crystallization Solvent | Chemical Structure | Packing Structure |
|---|---|---|---|
| 4-TBBP-SC | (c-hexane) | 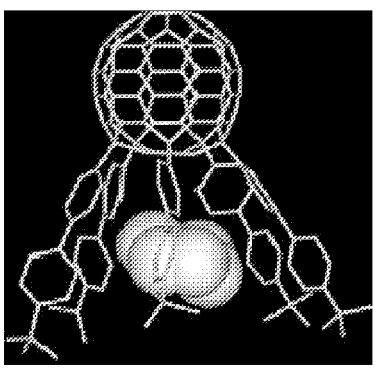 | 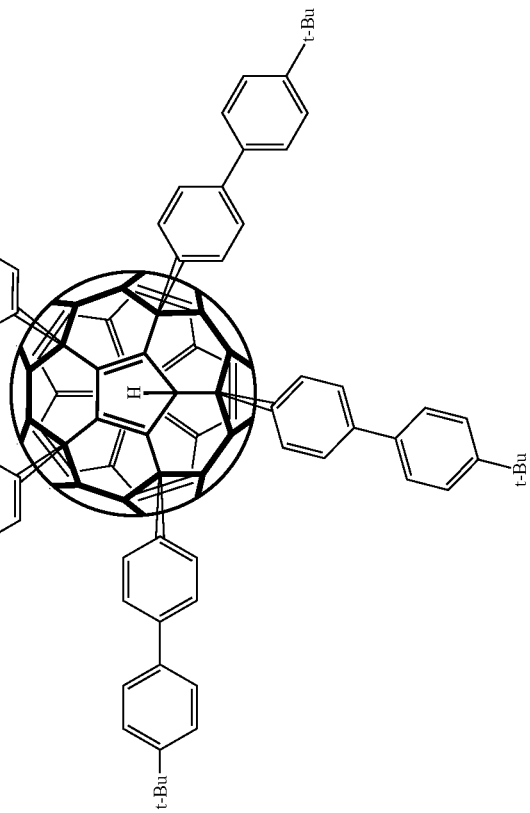 |

TABLE 2-continued
| Fullerene Derivative | Crystallization Solvent | Chemical Structure | Packing Structure |
|---|---|---|---|
| 3-RBP-SC | (CS$_2$) | 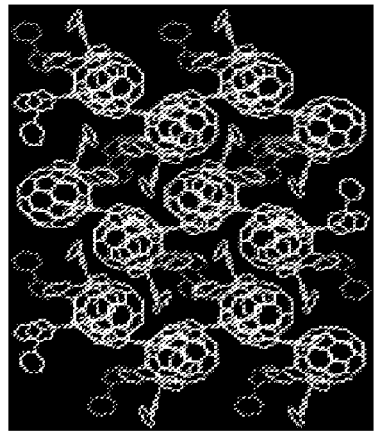 | 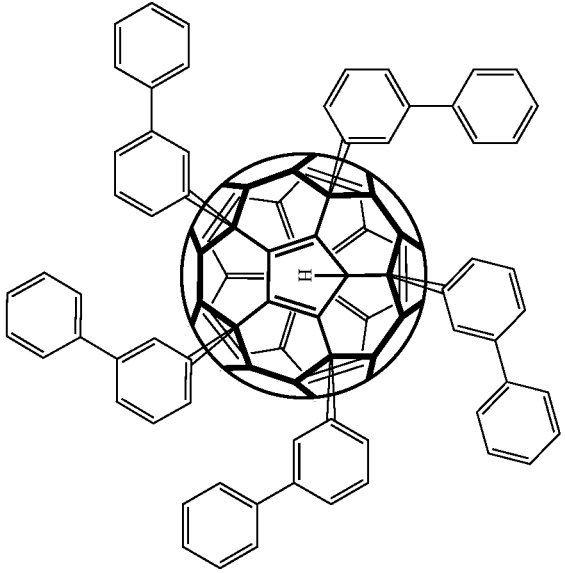 |

TABLE 2-continued
| Fullerene Derivative | Crystallization Solvent | Chemical Structure | Packing Structure |
|---|---|---|---|
| 4-POP-SC | (O-dichlorobenzene) | 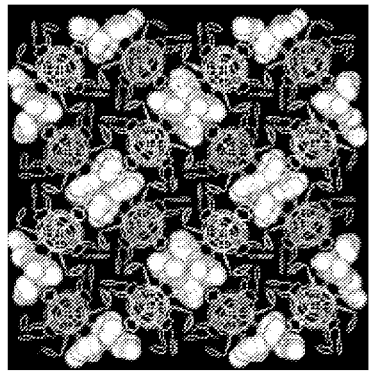 | 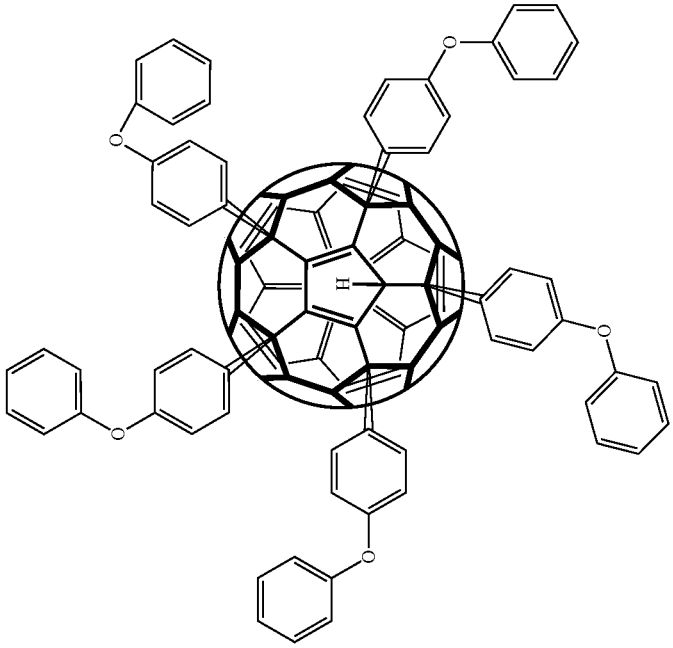 |

TABLE 2-continued
| Fullerene Derivative | Crystallization Solvent | Chemical Structure | Packing Structure |
|---|---|---|---|
| 4-SEt-SC | | 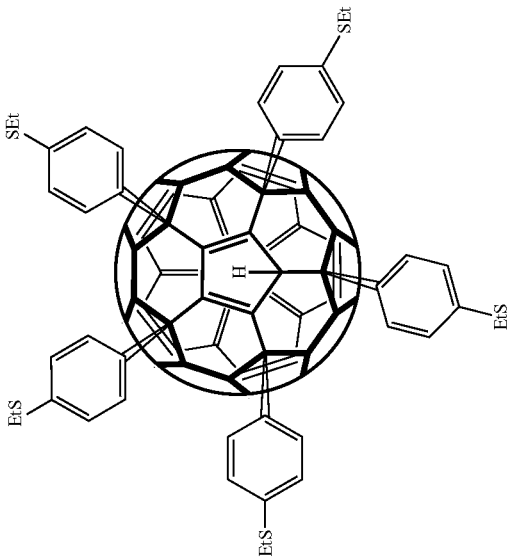 | 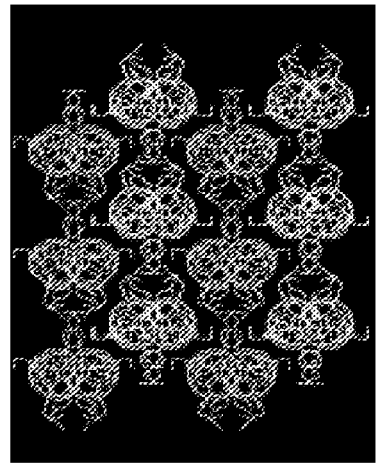 |

TABLE 2-continued
| Fullerene Derivative | Crystallization Solvent | Chemical Structure | Packing Structure |
|---|---|---|---|
| 4-APDK-SC | (toluene) | 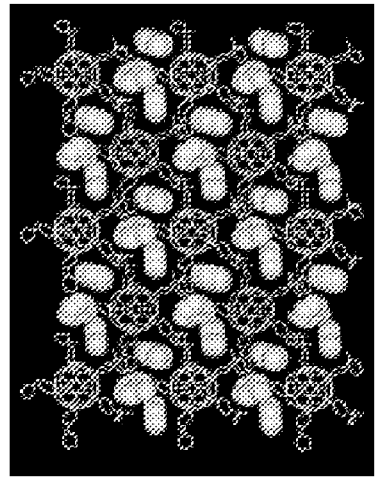 | 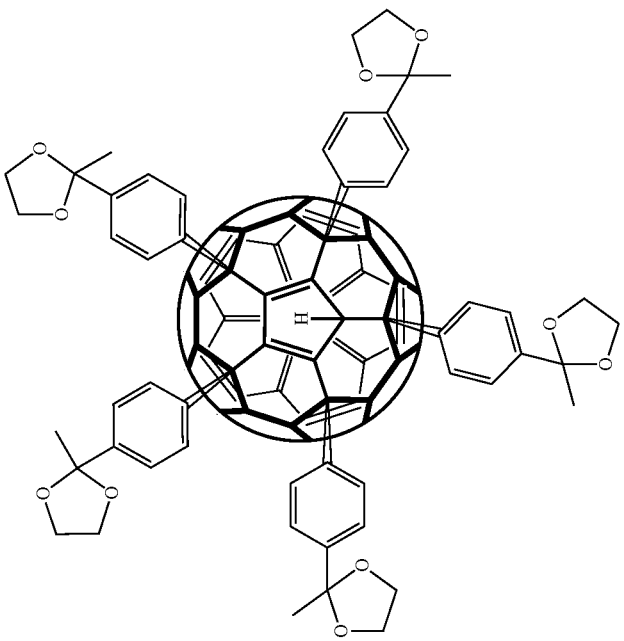 |

TABLE 2-continued

| Fullerene Derivative | Crystallization Solvent | Chemical Structure | Packing Structure |
|---|---|---|---|
| 4-BPDK-SC | (CHCl₃) | | |

TABLE 2-continued
| Fullerene Derivative | Crystallization Solvent | Chemical Structure | Packing Structure |
|---|---|---|---|
| 4-BPDK-SC | (chlorobenzene) |  | 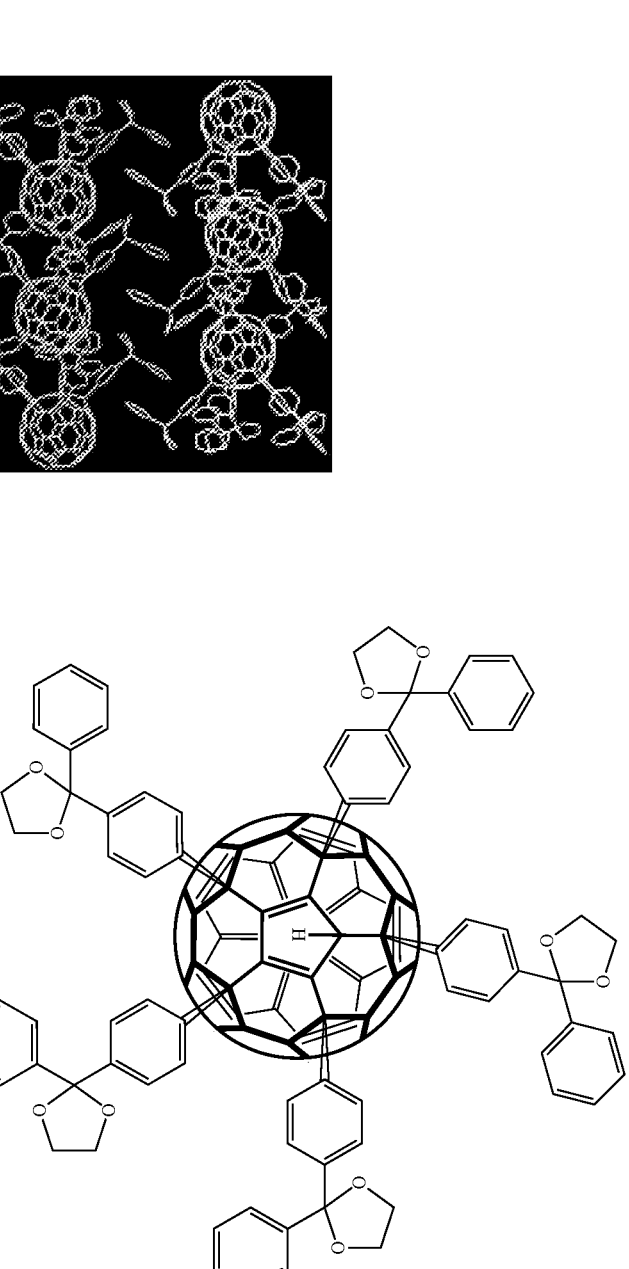 |

TABLE 2-continued
| Fullerene Derivative | Crystallization Solvent | Chemical Structure | Packing Structure |
|---|---|---|---|
| 4-BZPA-SC (partially robust stacker) | (CS$_2$) | 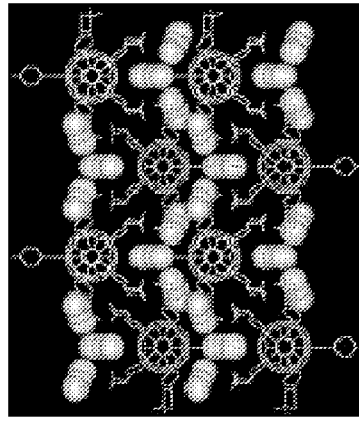 | 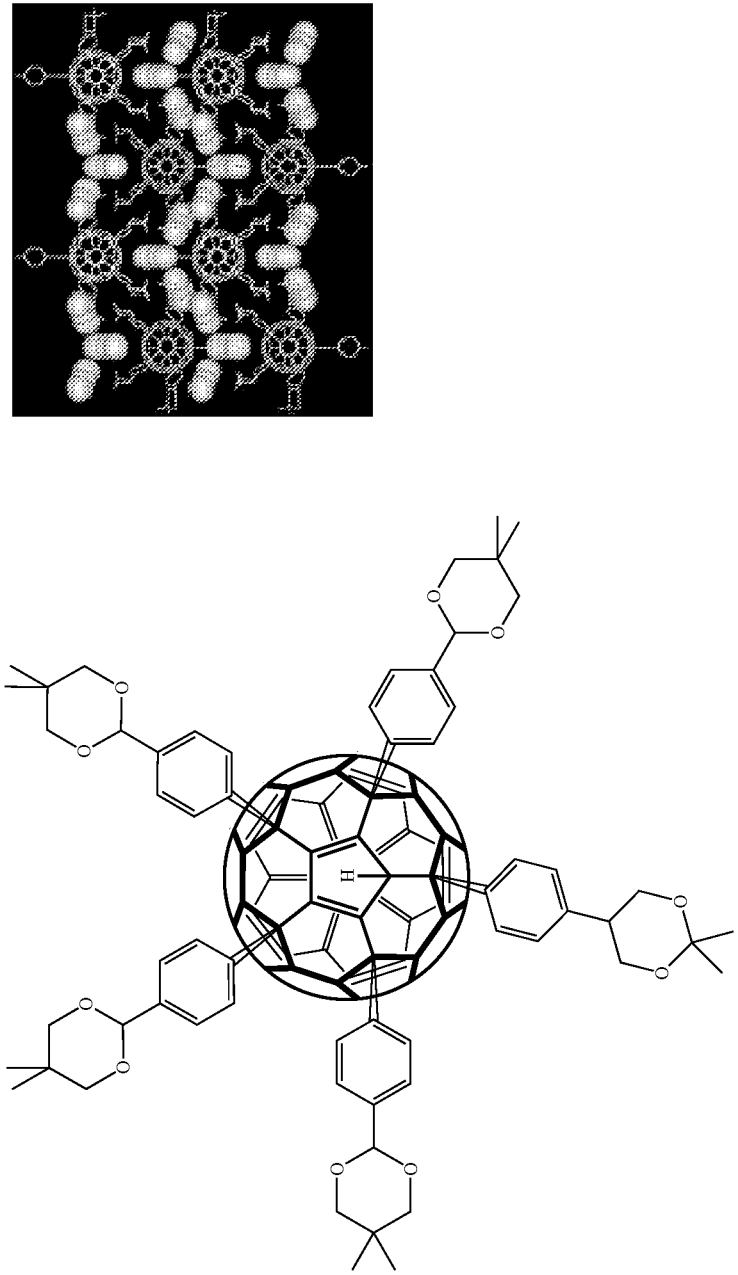 |

TABLE 2-continued
| Fullerene Derivative | Crystallization Solvent | Chemical Structure | Packing Structure |
|---|---|---|---|
| 4-BZPA-SC (partially robust stacker) | (1-chloronapthalene) | 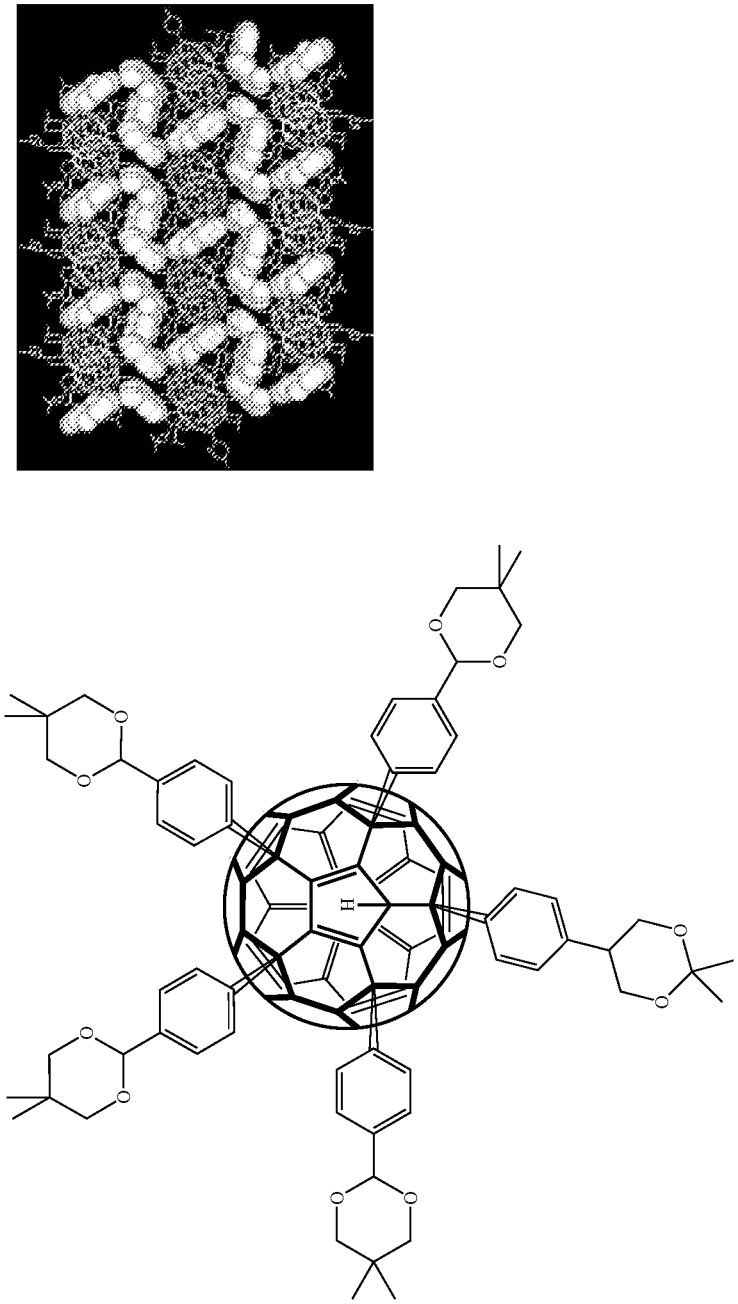 | |

TABLE 2-continued

| Fullerene Derivative | Crystallization Solvent | Chemical Structure | Packing Structure |
|---|---|---|---|
| 4-BZPA-SC (partially robust stacker) | (anisole) | | |

TABLE 2-continued

| Fullerene Derivative | Crystallization Solvent | Chemical Structure | Packing Structure |
|---|---|---|---|
| 4-BZPA-SC (partially robust stacker) | (toluene-isopropanol) | | |

TABLE 2-continued
| Fullerene Derivative | Crystallization Solvent | Chemical Structure | Packing Structure |
|---|---|---|---|
| 4-PEE-SC | (toluene) | 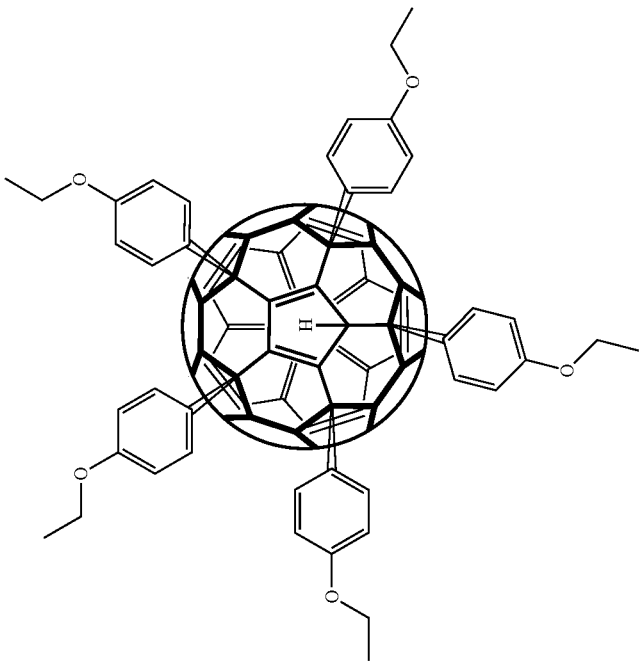 | 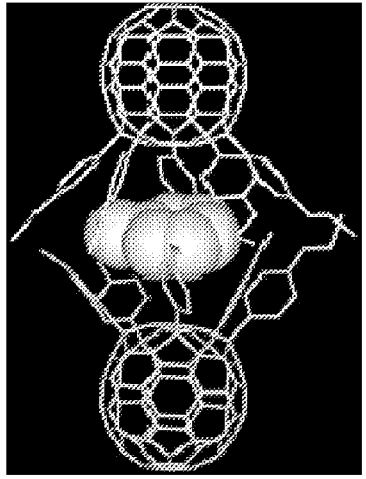 |

TABLE 2-continued
| Fullerene Derivative | Crystallization Solvent | Chemical Structure | Packing Structure |
|---|---|---|---|
| 4-PEE-SC | (CS$_2$) | 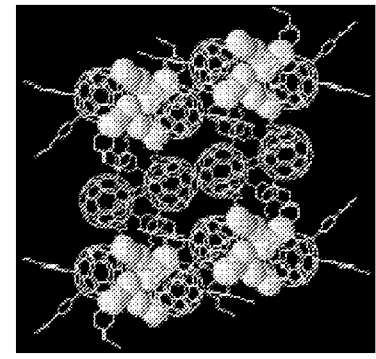 | 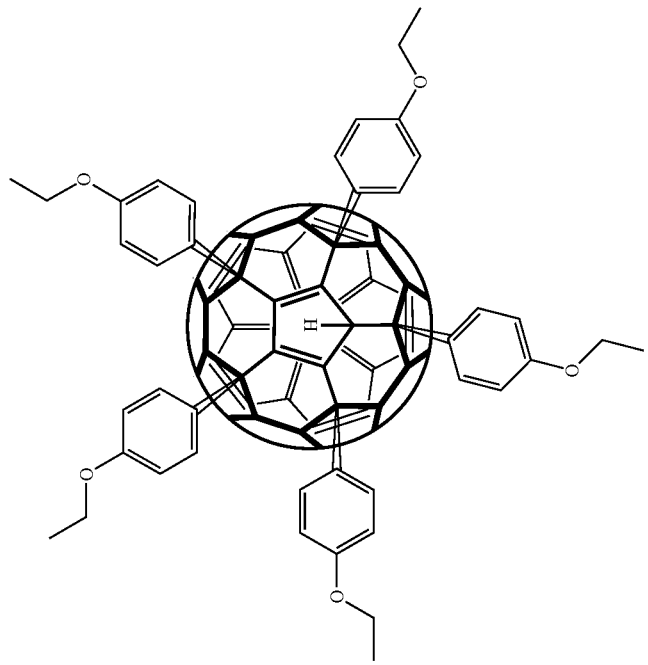 |

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 6,9,12,15,18-penta-substituted-1-hydro-$C_{60}$ given by the formula:

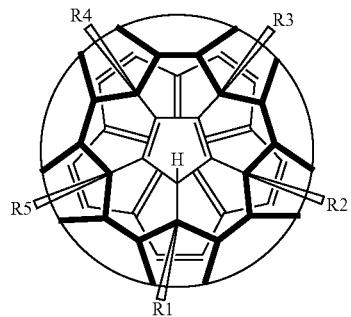

wherein $R_1$, $R_2$, $R_3$, $R_4$, and $R_5$ are independently selected from alkenyl groups, alkynyl groups, and aryl groups.

2. The photovoltaic device of claim 1, wherein $R_1$, $R_2$, $R_3$, $R_4$, and $R_5$ are independently selected from: (a) monocyclic aryl groups including 5-membered ring structures; and (b) polycyclic aryl groups including 5-membered ring structures.

3. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 6,9,12,15,18-penta-substituted-1-R—$C_{60}$ given by the formula:

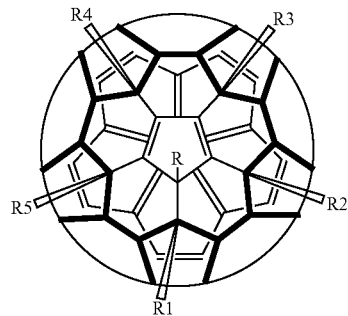

wherein $R_1$, $R_2$, $R_3$, $R_4$, and $R_5$ are independently selected from alkenyl groups, alkynyl groups, and aryl groups, and R is selected from deuteride group, halo groups, hydroxy group, methyl group, thio group, and metal cations.

4. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 1,9-epoxy-6,12,15,18-tetra-substituted-$C_{60}$ given by the formula:

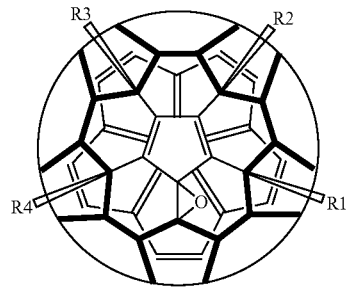

wherein $R_1$, $R_2$, $R_3$, and $R_4$ are independently selected from alkenyl groups, alkynyl groups, and aryl groups.

5. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 1,9-dihydroxy-6,12,15,18-tetra-substituted-$C_{60}$ given by the formula:

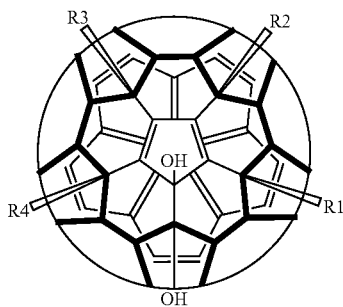

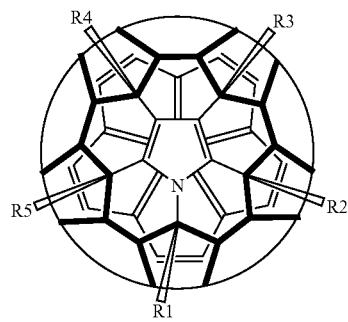

wherein $R_1$, $R_2$, $R_3$, and $R_4$ are independently selected from alkenyl groups, alkynyl groups, and aryl groups.

6. A photovoltaic device, comprising:

a first electrode layer;

a second electrode layer; and an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 6,12,15,18-tetra-substituted-$C_{60}$ given by the formula:

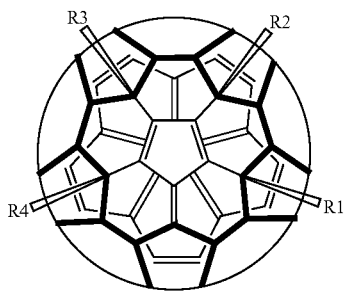

wherein $R_1$, $R_2$, $R_3$, and $R_4$ are independently selected from alkenyl groups, alkynyl groups, and aryl groups.

7. A photovoltaic device, comprising:

a first electrode layer;

a second electrode layer; and an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a 6,9,12,15,18-penta-substituted-1-aza-$C_{60}$ given by the formula:

wherein $R_1$, $R_2$, $R_3$, $R_4$, and $R_5$ are independently selected from alkenyl groups, alkynyl groups, and aryl groups.

8. The photovoltaic device of claim 7, wherein $R_1$, $R_2$, $R_3$, $R_4$, and $R_5$ are independently selected from: (a) monocyclic aryl groups including 5-membered ring structures;

and (b) polycyclic aryl groups including 5-membered ring structures.

9. A photovoltaic device, comprising:

a first electrode layer;

a second electrode layer; and an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a $C_{60}$ e,e,e-trisadduct given by the formula:

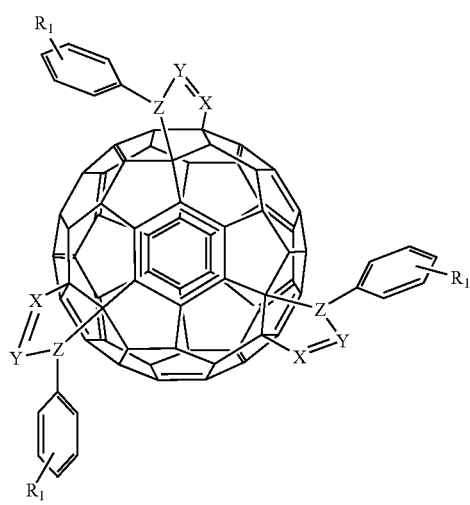

wherein X, Y, and Z are independently selected from O, S, $NR_2$, and $CR_3$, and $R_1$, $R_2$, and $R_3$ are independently selected from hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

10. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a $C_{60}$ e,e,e-trisadduct given by the formula:

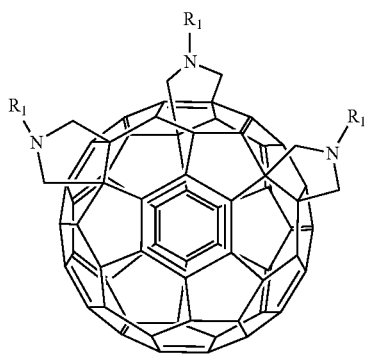

wherein $R_1$ is selected from hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

11. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a $C_{60}$ e,e,e-trisadduct given by the formula:

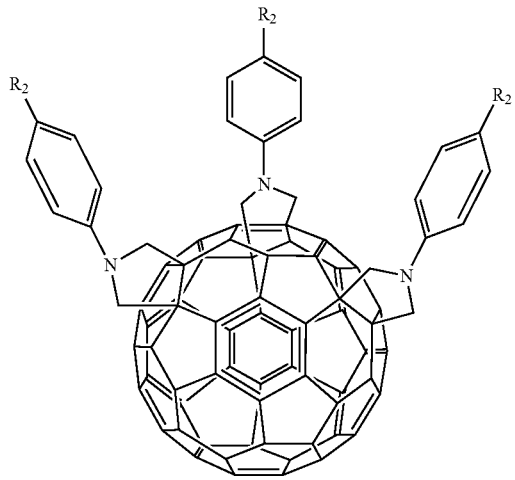

wherein $R_2$ is selected from hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

12. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a $C_{60}$ e,e,e-trisadduct given by the formula:

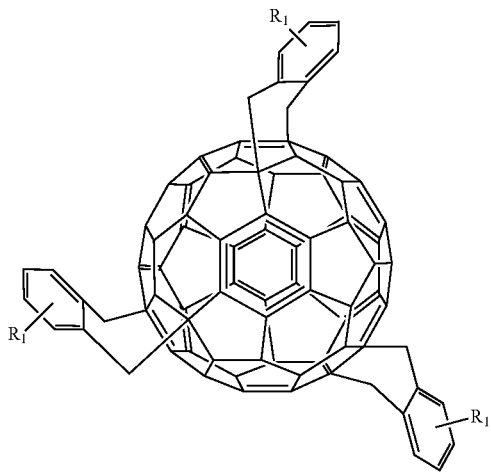

wherein $R_1$ is selected from hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

13. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are arranged into a packing structure to provide a conductive path through at least a portion of the active layer, wherein the fullerene derivative is a $C_{60}$ e,e,e-trisadduct given by the formula:

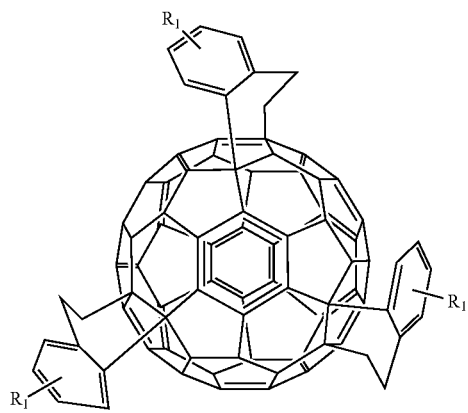

wherein $R_1$ is selected from hydride group, deuteride group, alkyl groups, alkenyl groups, alkynyl groups, aryl groups, alkylcarbonyl groups, alkenylcarbonyl groups, alkynylcarbonyl groups, arylcarbonyl groups, halo groups, hydroxy group, alkoxy groups, alkenoxy groups, alkynoxy groups, aryloxy groups, thio group, alkylthio groups, alkenylthio groups, alkynylthio groups, arylthio groups, cyano group, nitro group, amino group, N-substituted amino groups, amide group, N-substituted amide groups, silyl groups, and siloxy groups.

14. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are self-assembled into a packing structure to provide a conductive path through at least a portion of the active layer, the photovoltaic device having a solar energy conversion efficiency of at least 1.5 percent, wherein the fullerene derivative corresponds to a 6,9,12,15,18-penta-substituted fullerene.

15. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are self-assembled into a packing structure to provide a conductive path through at least a portion of the active layer, the photovoltaic device having a solar energy conversion efficiency of at least 1.5 percent, wherein the fullerene derivative corresponds to a 6,12,15,18-tetra-substituted fullerene.

16. A photovoltaic device, comprising:
a first electrode layer;
a second electrode layer; and
an active layer disposed between the first electrode layer and the second electrode layer, the active layer being configured to absorb incident light to produce a first type of charge carrier that is transported to the first electrode layer and a second type of charge carrier that is transported to the second electrode layer, the active layer including molecules of a fullerene derivative that are self-assembled into a packing structure to provide a conductive path through at least a portion of the active layer, the photovoltaic device having a solar energy conversion efficiency of at least 1.5 percent, wherein the fullerene derivative corresponds to a fullerene e,e,e-trisadduct.

17. The photovoltaic device of any one of claims 14-16, wherein the active layer includes a matrix that is configured to provide transport of the first type of charge carrier, and the self-assembled molecules of the fullerene derivative are disposed in the matrix and are configured to provide transport of the second type of charge carrier.

18. The photovoltaic device of claim 17, wherein the matrix includes a semiconducting polymer, and the solar energy conversion efficiency is at least 3 percent.

19. The photovoltaic device of any one of claims 14-16, wherein a density of the self-assembled molecules of the fullerene derivative in a crystalline form is in the range of $8\times10^{-4}$ molecules/Å$^3$ to $11\times10^{-4}$ molecules/Å$^3$.

* * * * *